(12) United States Patent
Kato et al.

(10) Patent No.: US 10,440,846 B2
(45) Date of Patent: Oct. 8, 2019

(54) BRACKET AND ASSEMBLY STRUCTURE FOR BRACKET

(71) Applicants: DAIWA KASEI INDUSTRY CO., LTD., Aichi (JP); TOYOTA JIDOSHA KABUSHIKI KAISHA, Aichi-ken (JP)

(72) Inventors: Makoto Kato, Aichi (JP); Hirofumi Kataoka, Aichi (JP); Yoshiki Inamukai, Aichi-ken (JP)

(73) Assignees: DAIWA KASEI INDUSTRY CO., LTD., Aichi (JP); TOYOTA JIDOSHA KABUSHIKI KAISHA, Aichi-Ken (JP)

( * ) Notice: Subject to any disclaimer, the term of this patent is extended or adjusted under 35 U.S.C. 154(b) by 0 days.

(21) Appl. No.: 15/954,723

(22) Filed: Apr. 17, 2018

(65) Prior Publication Data

US 2018/0310421 A1 Oct. 25, 2018

(30) Foreign Application Priority Data

Apr. 21, 2017 (JP) ................ 2017-084197

(51) Int. Cl.
*F16M 11/00* (2006.01)
*H05K 5/02* (2006.01)
(Continued)

(52) U.S. Cl.
CPC ............. *H05K 5/0204* (2013.01); *F16B 2/22* (2013.01); *H05K 5/0017* (2013.01);
(Continued)

(58) Field of Classification Search
CPC ...... F16B 2/22; H05K 5/0017; H05K 5/0052; H05K 5/0204
See application file for complete search history.

(56) References Cited

U.S. PATENT DOCUMENTS 5,664,292 A 9/1997 Chen
6,095,470 A * 8/2000 Kalis ............... B60R 11/02
248/309.1

(Continued)

FOREIGN PATENT DOCUMENTS

| JP | 200234118 | 1/2002 |
| JP | 200234118 A | 1/2002 |
| JP | 2006-220171 A | 8/2006 |

OTHER PUBLICATIONS

JP Office Action dated Feb. 18, 2019 in JP application (No. 2017-084197).

(Continued)

*Primary Examiner* — Amy J. Sterling
(74) *Attorney, Agent, or Firm* — McClure, Qualey & Rodack, LLP

(57) ABSTRACT

A bracket for attaching an electronic control unit to a panel member is provided with: a plate-shaped insertion portion to be inserted into a gap between an outer peripheral side surface of a case of an electronic control unit and an elastic pressing portion which protrudes from the outer peripheral side surface and bends and extends in an outer circumferential direction of the case; a detachment preventing latch portion to be latched with the elastic pressing portion of the case, thereby retaining the case in a detachment prevented state, when the insertion portion is inserted to a predetermined assembled position in the gap; and abutting wall portions which extend from the side surface opposed portion on both outer sides in the outer circumferential direction of the insertion portion, to come into contact with the outer peripheral side surface, in the detachment prevented state.

5 Claims, 28 Drawing Sheets

(51) Int. Cl.
  *F16B 2/22*   (2006.01)
  *H05K 5/00*   (2006.01)
  *H05K 5/03*   (2006.01)
  *F16B 5/06*   (2006.01)
  *F16B 5/12*   (2006.01)

(52) U.S. Cl.
  CPC ......... *H05K 5/0052* (2013.01); *H05K 5/0073* (2013.01); *H05K 5/0221* (2013.01); *H05K 5/0247* (2013.01); *H05K 5/03* (2013.01); *F16B 5/065* (2013.01); *F16B 5/0664* (2013.01); *F16B 5/121* (2013.01)

(56) References Cited

U.S. PATENT DOCUMENTS

| | | | | |
|---|---|---|---|---|
| 7,863,862 | B2* | 1/2011 | Idzik | H02J 7/0044 |
| | | | | 320/114 |
| 8,833,716 | B2* | 9/2014 | Funk | F16M 13/02 |
| | | | | 248/316.4 |
| 2015/0301562 | A1* | 10/2015 | Williams | G06F 1/1632 |
| | | | | 361/679.43 |
| 2018/0295975 | A1* | 10/2018 | Washington | A45F 5/021 |
| 2019/0132018 | A1* | 5/2019 | Carnevali | H04B 1/3888 |

OTHER PUBLICATIONS

English translation of JP Office Action dated Feb. 18, 2019 in JP application (No. 2017-084197).
Office Action dated May 24, 2019, issued in U.S. Appl. No. 15/954,732 (copy not provided).

* cited by examiner

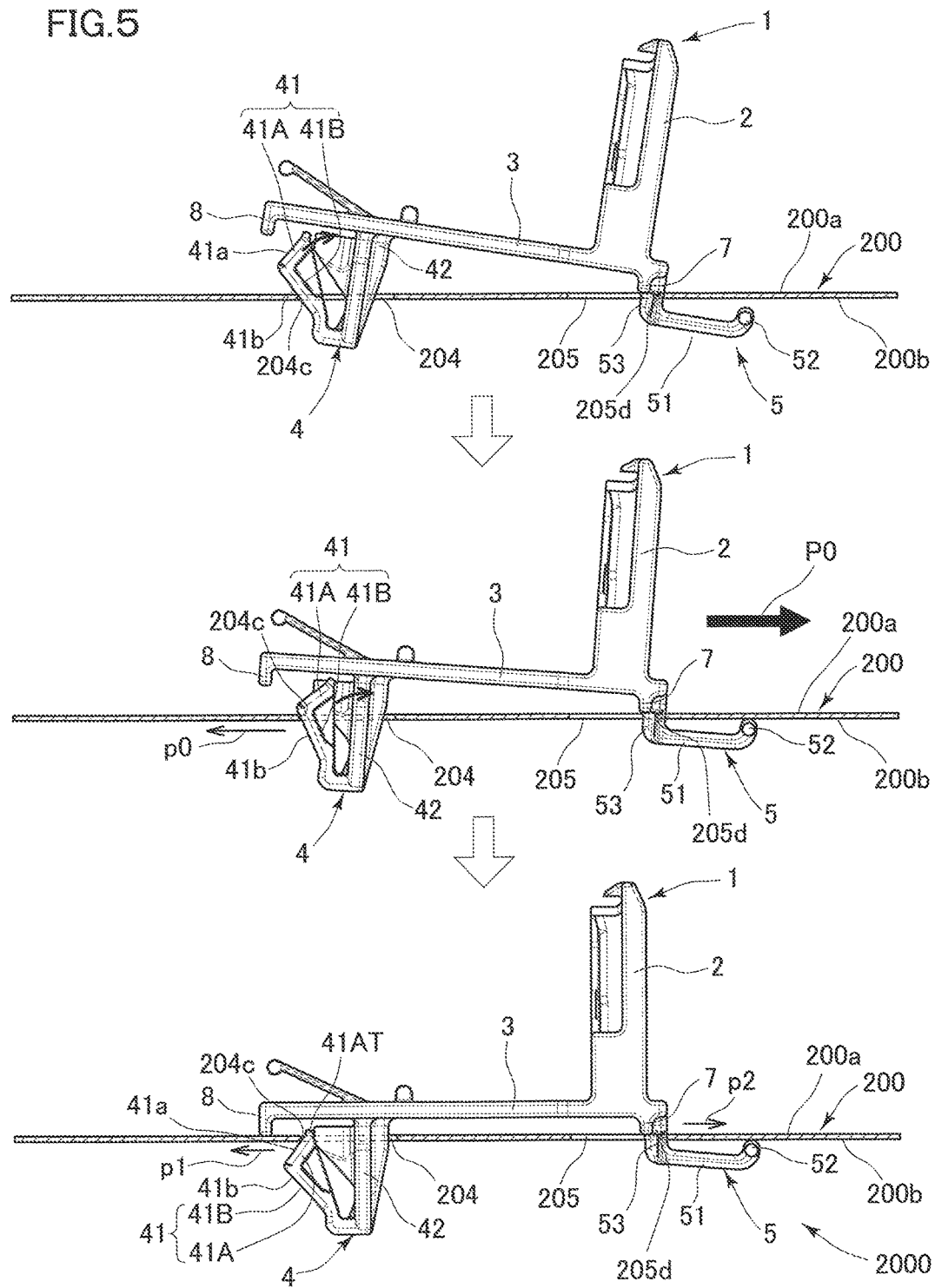

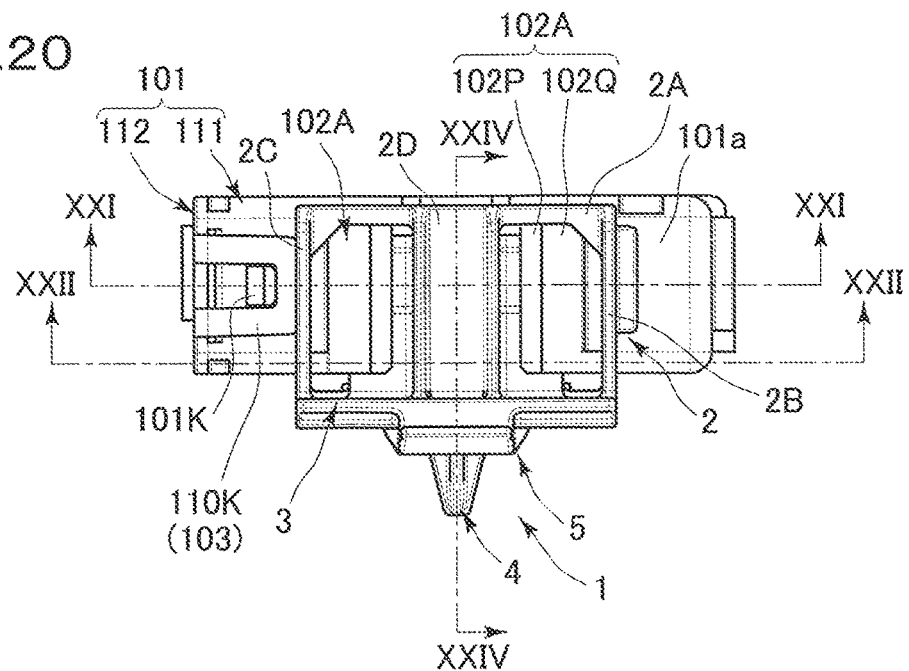
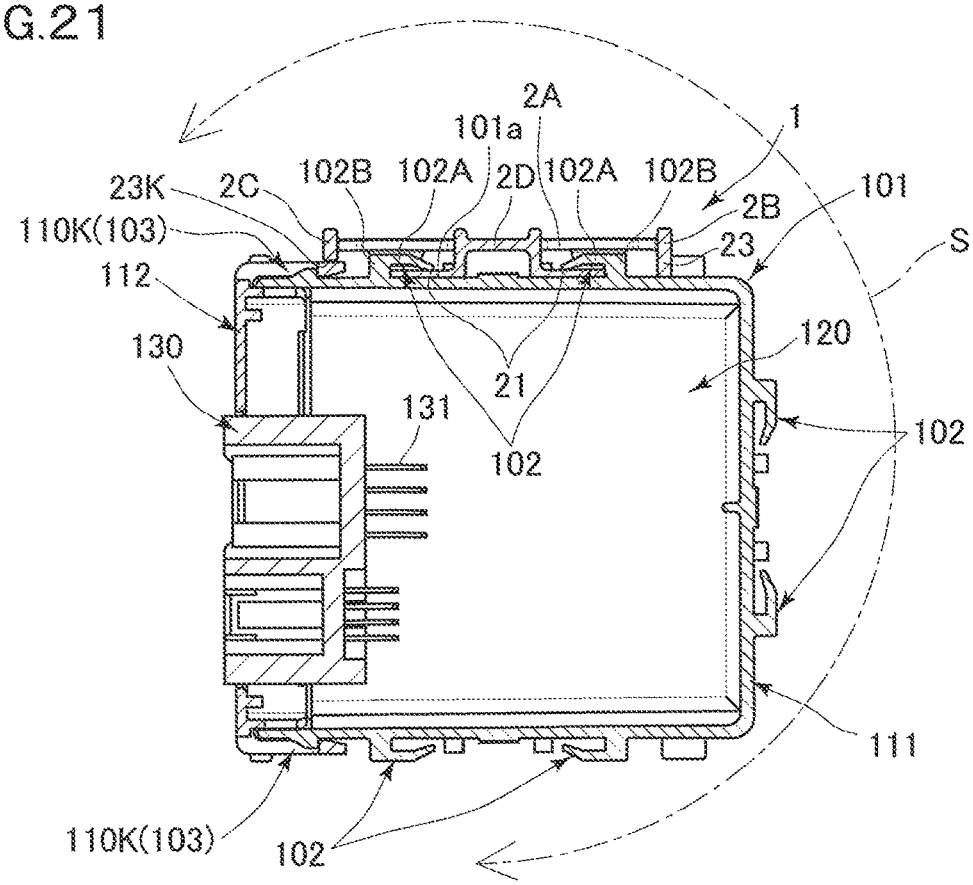

BRACKET AND ASSEMBLY STRUCTURE FOR BRACKET

RELATED APPLICATIONS

This application claims the priority of Japanese Patent Application No. 2017-084197 filed on Apr. 21, 2017. The disclosure of the prior application is hereby incorporated herein in the entirety by reference.

BACKGROUND OF THE INVENTION

Field of the Invention

This invention relates to a bracket to be assembled to a case such as an ECU case, and an assembly structure for assembling the bracket to the case.

Description of Related Art

For example, an electronic control unit (ECU) for a vehicle is mounted to a vehicle body such that an ECU case including a circuit board is attached via a bracket to a panel member of the vehicle body. Here, as a method for assembling the bracket and the case, for example, Japanese Laid-Open Patent Publication No. 2006-220171 discloses a method in which a plate-shaped insertion portion provided to a bracket is inserted into a gap between one outer peripheral side surface of an ECU case and L-shaped opposed pressing portions which protrude on the outer peripheral side surface so as to be opposed to each other in the outer circumferential direction of the case and bend in such directions as to approach each other, thereby assembling the case and the bracket.

However, in this method, when a vehicle body vibrates due to travelling vibration of the vehicle or the like, there is a possibility that the bracket is rocked in the outer circumferential direction of the case so as to cause rattling.

An object of this invention is to prevent the bracket from rattling in the outer circumferential direction of the case when the bracket is assembled to the case.

SUMMARY OF THE INVENTION

In order to achieve the above object, a bracket of this invention is a bracket for attaching an electronic control unit to a predetermined member, the bracket including: a bracket body having a main surface opposed portion which is to face a main surface of a case of the electronic control unit, and a side surface opposed portion which extends in a bending direction from the main surface opposed portion and which is to face an outer peripheral side surface of the case; a plate-shaped insertion portion to be inserted into a gap between the outer peripheral side surface of the case and an elastic pressing portion which protrudes from the outer peripheral side surface and then, at a protruding end thereof, bends and extends in an outer circumferential direction of the case; a detachment preventing latch portion configured to, when the insertion portion is inserted to a predetermined assembled position in the gap, be latched with a predetermined latch portion of the case, thereby retaining the case in a detachment prevented state; and abutting wall portions which extend toward the outer peripheral side surface of the case from the side surface opposed portion, on both outer sides in the outer circumferential direction of the insertion portion, and which are to be located in contact with the outer peripheral side surface.

In the above configuration, when the insertion portion of the bracket is inserted into the gap between the outer peripheral side surface of the case and the elastic pressing portion protruding from the outer peripheral side surface and extending from the protruding end in the outer circumferential direction of the case, the detachment preventing latch portion of the bracket is latched with the latch portion of the case, whereby the case and the bracket are assembled in the detachment prevented state. In addition, the bracket has the abutting wall portions which come into contact with the outer peripheral side surface of the case on both outer sides in the outer circumferential direction of the case with respect to the insertion portion inserted into the gap of the case, in the assembled state. By the abutting wall portion on both outer sides, the bracket is prevented from rattling in the outer circumferential direction of the case. That is, in the insertion structure for assembling the case and the bracket, rattling is likely to occur by the bracket moving in the outer circumferential direction of the case, but since the abutting wall portions are provided to further outer sides sandwiching the insertion structure, the rattling can be effectively suppressed.

In the above configuration, the abutting wall portions may be formed to extend along an insertion direction of the insertion portion, and connected to the main surface opposed portion. In this configuration, since the abutting wall portions are formed as wall portions elongated in the insertion direction, longer contact areas with the outer peripheral side surface of the case are ensured, whereby rattling can be stably suppressed. In addition, since the abutting wall portions elongated in the insertion direction are connected to the main surface opposed portion, rigidity of the abutting wall portions increases and rattling can be more stably suppressed.

In the above configuration, the side surface opposed portion may have, in a state of being assembled to the case, a frame shape having: an end frame portion opposed to the main surface opposed portion; a first side frame portion connecting the end frame portion and the main surface opposed portion, on a first side in the outer circumferential direction; a second side frame portion connecting the end frame portion and the main surface opposed portion, on a second side opposite to the first side; and a central frame portion connecting the end frame portion and the main surface opposed portion, at a center in the outer circumferential direction.

In the case where the side surface opposed portion has the frame shape, the abutting wall portions can be formed on the first side frame portion and the second side frame portion. In this configuration, it is possible to form the abutting wall portions using the frame portions forming the frame shape of the side surface opposed portion, and therefore it is not necessary to add an extra structure for forming the abutting wall portions.

In the case where the side surface opposed portion has the frame shape, on the end frame portion, the detachment preventing latch portion may be formed at a center of a zone between a central connection portion connected with the central frame portion and each of side connection portions connected with the first and second side frame portions, and the end frame portion may have, on both sides of the center of the zone, weak portions having lower rigidity than the detachment preventing latch portion. Thus, at a time of bringing the case into the detachment prevented state, the insertion portion of the bracket is inserted into the gap between the outer peripheral side surface and the elastic pressing portion of the case in a predetermined insertion direction which is parallel with the outer peripheral side surface and perpendicular to the outer circumferential direction of the case. In the insertion, the elastic pressing portion of the case is received in a direction opposite to the insertion direction through an opposition clearance between each detachment preventing latch portion protruding downward and the insertion portion in the bracket, whereby the insertion portion reaches the assembled position in the gap, while in the reception, the elastic pressing portion presses each detachment preventing latch portion, whereby a center of the end frame portion is pushed up with the weak portions elastically deformed, so as to expand the opposition clearance and allow the elastic pressing portion to be received. After the reception, the end frame portion is elastically restored, whereby the received elastic pressing portion is, as the predetermined latch portion, latched by the detachment preventing latch portion, so that the detachment prevented state can be established.

In this configuration, in order to insert the insertion portion of the bracket into the gap between the outer peripheral side surface and the elastic pressing portion of the case, it is necessary to insert the elastic pressing portion into the opposition clearance between the detachment preventing latch portion and the insertion portion of the bracket. However, the detachment preventing latch portion has a shape protruding downward for latching the elastic pressing portion inserted into the opposition clearance, from the opposite side in the insertion direction, so as to prevent detachment. Therefore, at the time of inserting the elastic pressing portion of the case into the opposition clearance between the detachment preventing latch portion and the insertion portion of the bracket, the insertion is hampered. In order to allow the insertion, the bracket needs to be elastically deformed so as to expand the opposition clearance. In this regard, in the above configuration, the weak portions are formed in zones on both sides adjacent to the detachment preventing latch portion, and therefore, using the weak portions effectively, it is possible to cause elastic deformation so as to expand the opposition clearance by pushing up the detachment preventing latch portion protruding downward.

An assembly structure for bracket according to this invention is an assembly structure for assembling the above-described bracket to a case of an electronic control unit, wherein the case has a protrusion protruding outward, at a position corresponding to one of the abutting wall portions on the outer peripheral side surface of the case, and the bracket has, in the one of the abutting wall portions, a cutout portion formed so as not to interfere with the protrusion.

In the above configuration, at the time of assembling the bracket to the case, it is necessary to match the position of the protrusion of the case and the position of the cutout portion of the bracket. Therefore, even in the case where assembly portions for assembling the bracket to the case are provided on a plurality of outer peripheral side surfaces of the case, it is possible to prescribe the assembly portion to which the bracket should be assembled, the assembly direction (insertion direction of the insertion portion of the bracket), and the like, by deliberately providing the protrusions on the case, and thus erroneous assembly can be prevented.

In the above assembly structure, the case may have a body part having an opening in one surface of an outer periphery of the case, and a cover assembled so as to cover the opening, the cover may have assembly portions assembled so as to overlap both outer peripheral side surfaces adjacent to the opening on the outer periphery of the case and thus each forming the protrusion, and the cutout portion may be located so as to overlap the corresponding assembly portion, thereby preventing release of an assembled state of the cover with respect to the opening.

In the above configuration, by the position of the protrusion of the case and the cutout portion of the bracket, it is possible to not only prevent erroneous assembly but also prevent the cover from coming off.

BRIEF DESCRIPTION OF THE DRAWINGS

FIG. 5 illustrates an attachment method for attaching the bracket to the panel member;

FIG. 20 is a plan view of the bracket and the case in FIG. 1;

FIG. 21 is a sectional view along XXI-XXI line in FIG. 10;

DESCRIPTION OF THE PREFERRED EMBODIMENTS

Figure 1:
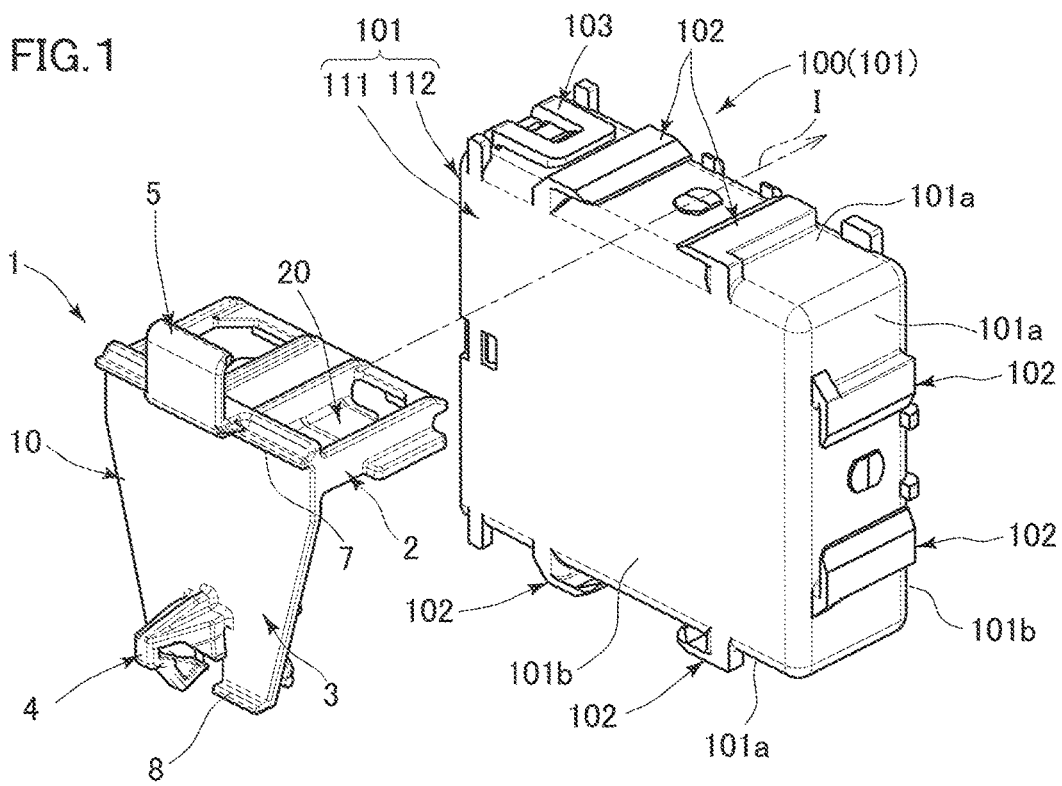
FIG. 1 is an exploded perspective view showing a bracket and a case separated from each other in an assembly structure for the bracket and the case according to the first embodiment of this invention.

Embodiments of this invention will be described with reference to examples shown in the drawings.

Figure 2:
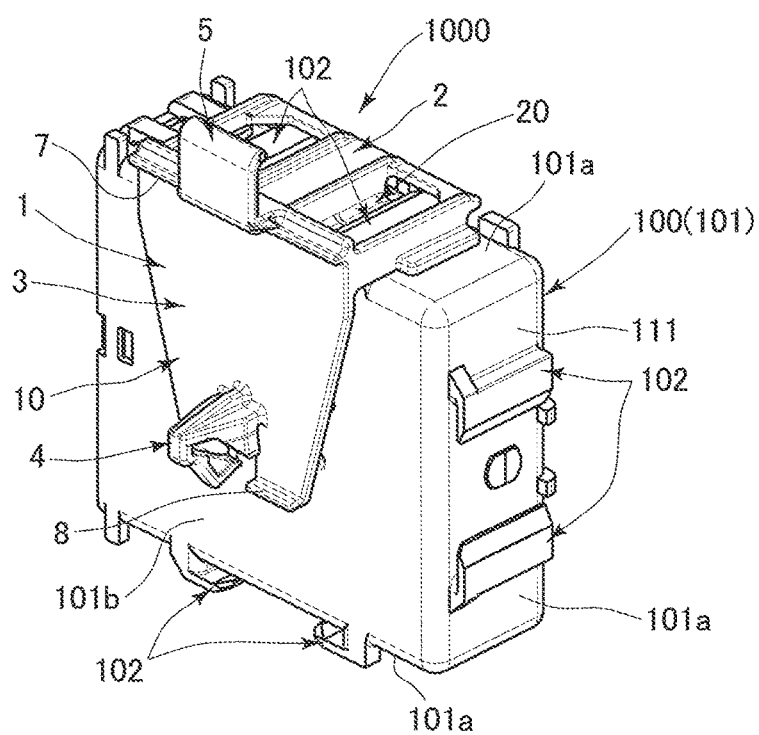
FIG. 2 is a perspective view showing the assembly structure in which the bracket and the case in FIG. 1 are assembled with each other.
Figure 3:
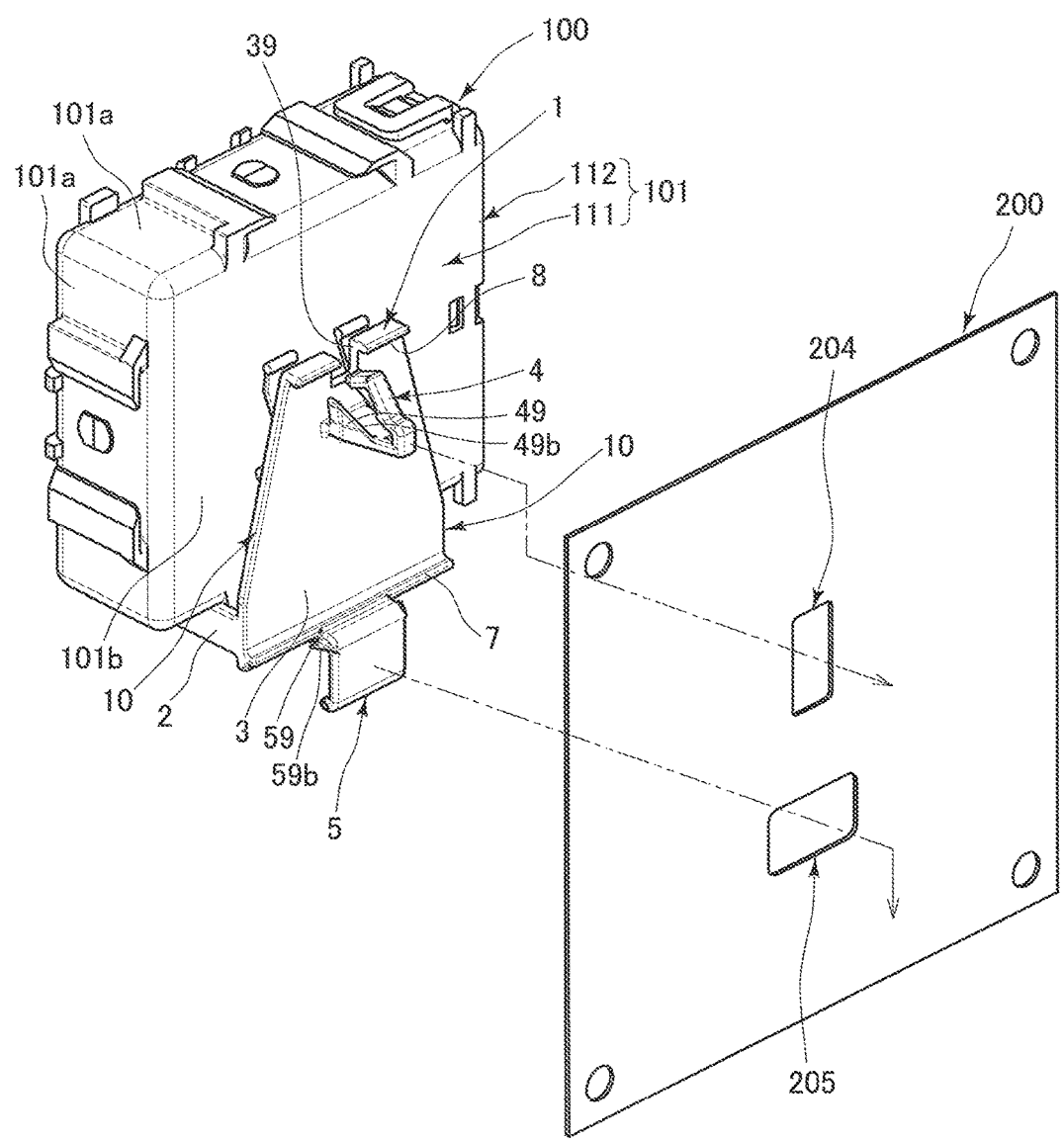
FIG. 3 is an exploded perspective view showing the bracket and a panel member separated from each other in an attachment structure for the bracket and the panel member according to the first embodiment of this invention.
Figure 4:
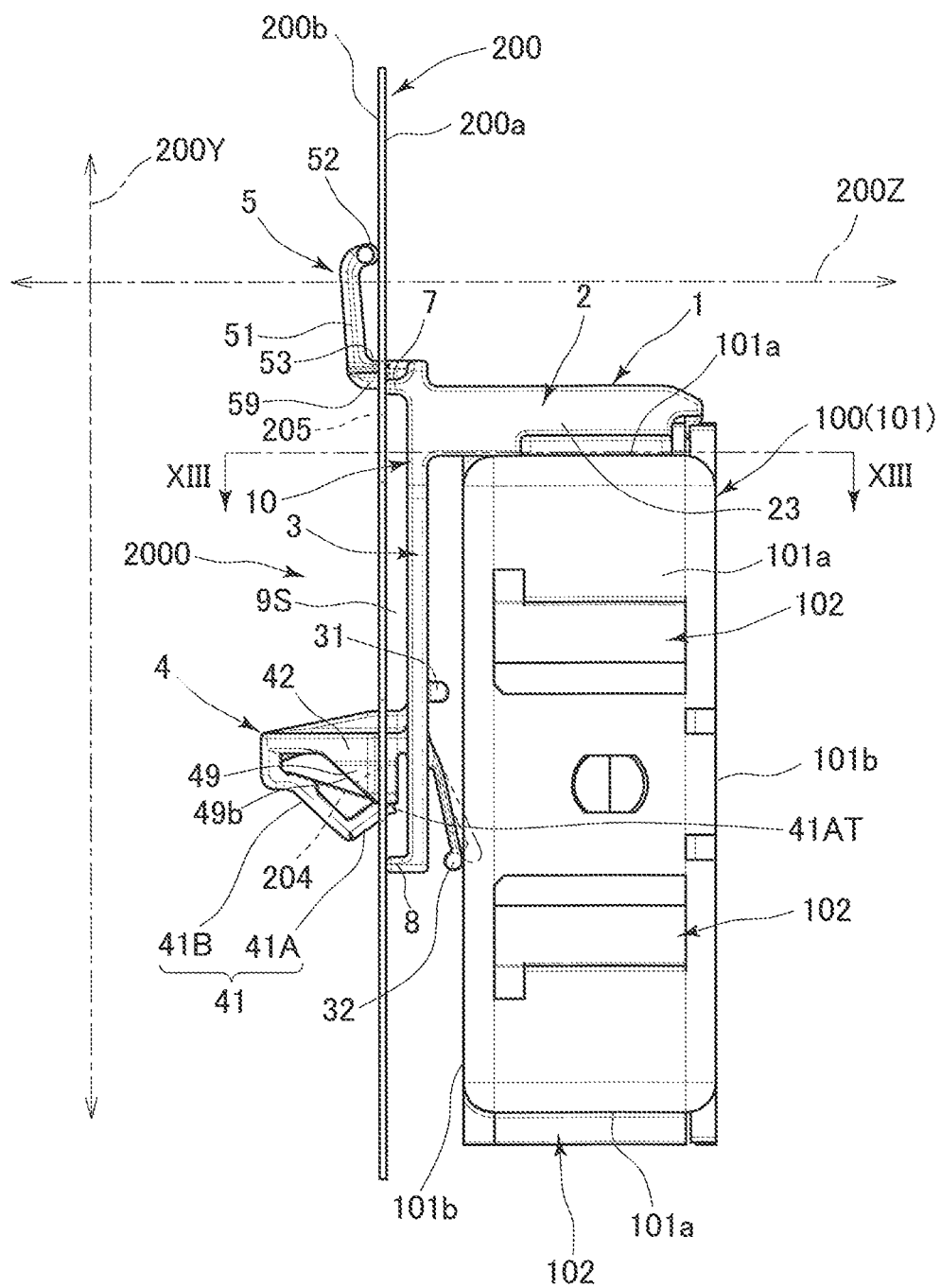
FIG. 4 is a side view showing the attachment structure in which the bracket is attached to the panel member in FIG. 3.

In this embodiment, as shown in FIG. 1 and FIG. 2, an assembly structure 1000 (see FIG. 2) for assembling a bracket 1 to a case 101 is formed, and as shown in FIG. 3 and FIG. 4, an attachment structure 2000 (see FIG. 4) for attaching the bracket 1 to a panel member 200 is formed. Hereinafter, the assembly structure 1000 and the attachment structure 2000 will be described.

Figure 18:
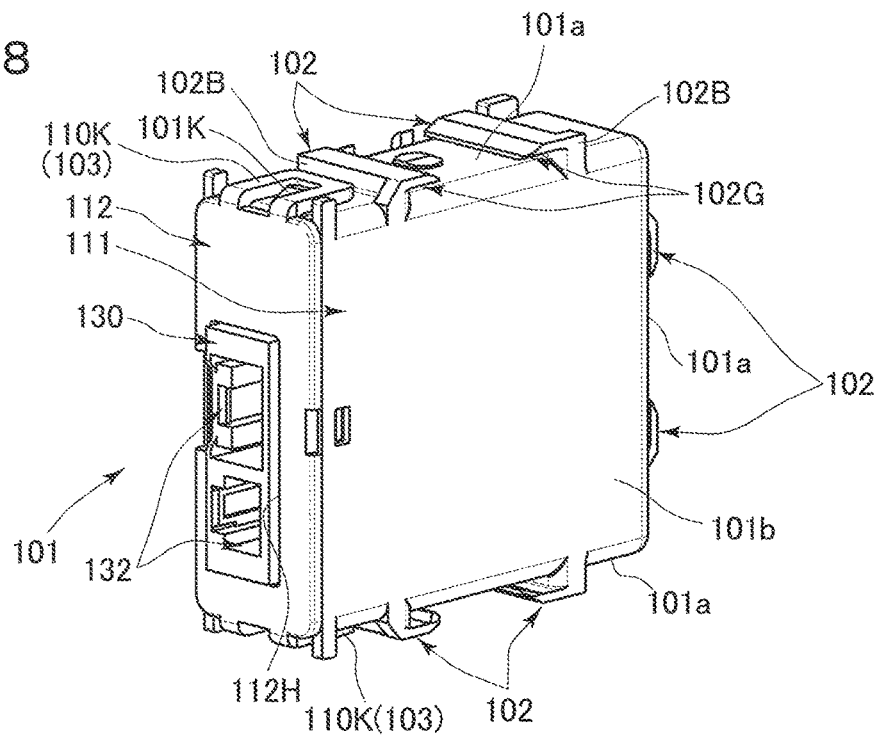
FIG. 18 is a perspective view showing the case in FIG. 1.
Figure 19:
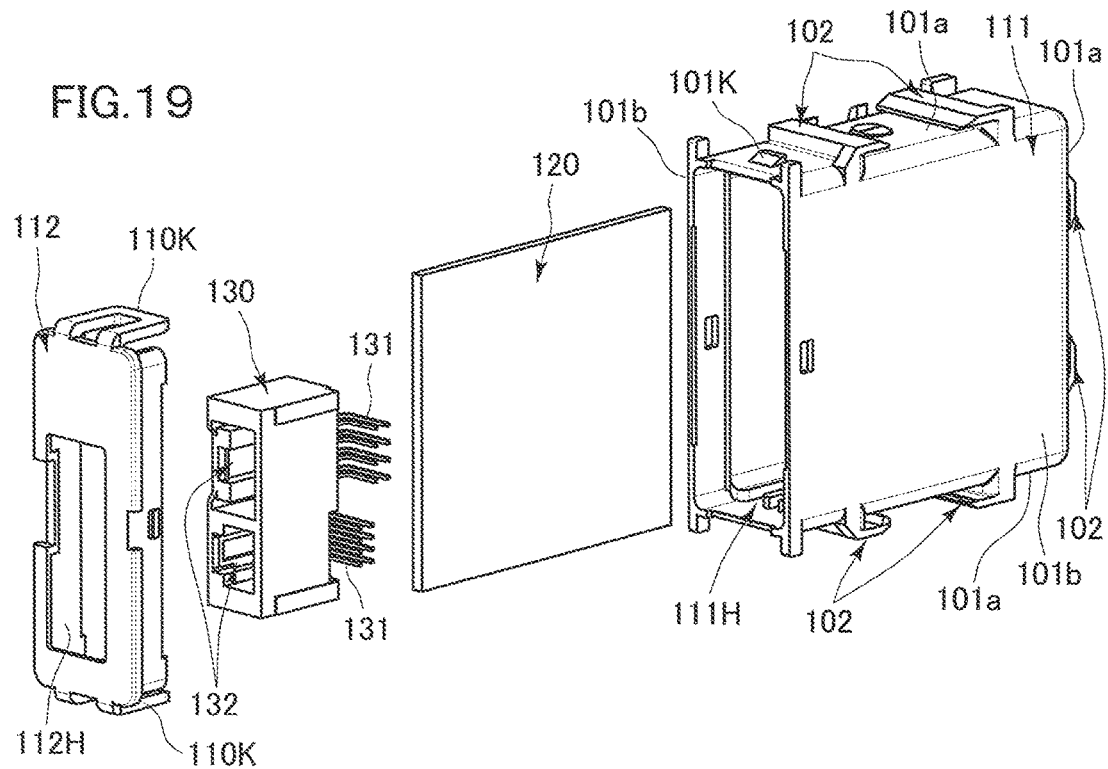
FIG. 19 is an exploded perspective view of the case in FIG. 18.

The case 101 is a housing for an electronic control unit (ECU) 100. Therefore, the assembly structure 1000 of this embodiment can be also said to be an assembly structure for assembling the bracket 1 to the ECU 100. As shown in FIG. 18 and FIG. 19, the ECU 100 has the case 101, a circuit board 120 included in the case 101, and a connector 130 for connection with the circuit board 120.

The case 101 has quadrangular main surfaces 101*b* opposed to each other, and outer peripheral side surfaces 101*a* surrounding the outer periphery of the opposition space between the main surfaces 101*b*. However, a body part 111 of the case 101 covers only three sides (i.e., three surfaces) of the outer periphery of the opposition space between the main surfaces 101*b* and thus has the rectangular outer peripheral side surfaces 101*a* on the three sides, while an opening 111H is formed on the remaining one side (i.e., one surface). The circuit board 120 is stored into the body part 111 through the opening 111H. The connector 130 is assembled to the circuit board 120 with a terminal portion 131 connected thereto. When the circuit board 120 is stored in the body part 111, the connector 130 comes into a state in which a connection portion 132 thereof to be connected to a counterpart connector is exposed from the opening 111H. The case 101 has a cover 112 assembled to the body part 111 so as to cover the opening 111H. The cover 112 has a connector opening 112H allowing the connector 130 to be exposed, and is assembled to the body part 111 so as to close the gap between the connector 130 and the inner edge of the opening 111H of the case 101.

The bracket 1 is made of resin, and as shown in FIG. 1 and FIG. 2, has a bracket body 10 and assembly portions 20 to be assembled with the case 101.

In an assembled state (see FIG. 2) of being assembled with the case 101 by the assembly portions 20, the bracket body 10 has: a main surface opposed portion 3 located so as to face the main surface 101*b* of the case 101; and a side surface opposed portion 2 extending from the main surface opposed portion 3 to the main surface 101*b* side and located at a position opposed to the outer peripheral side surface 101*a* of the case 101.

Figure 7:
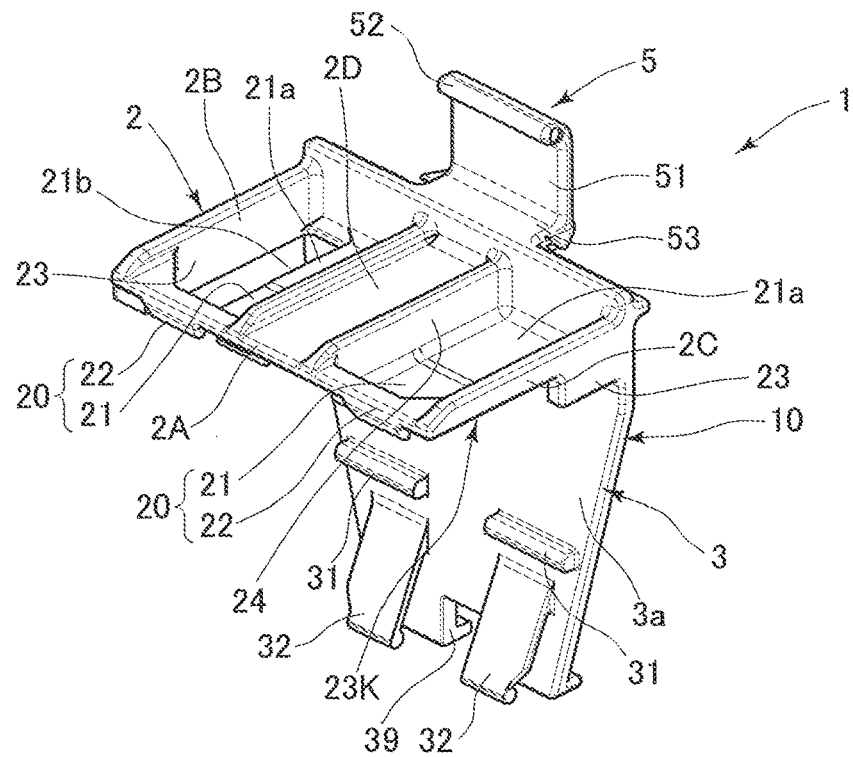
FIG. 7 is a perspective view of the bracket in FIG. 1.
Figure 8:
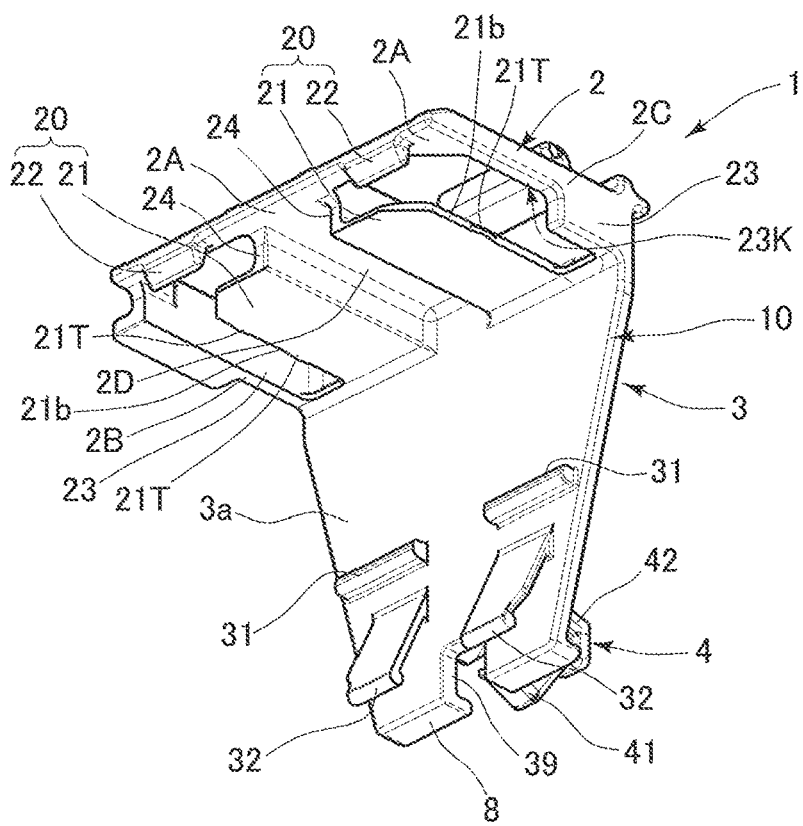
FIG. 8 is a perspective view of the bracket in FIG. 1 as seen from a direction different from FIG. 7.
Figure 9:
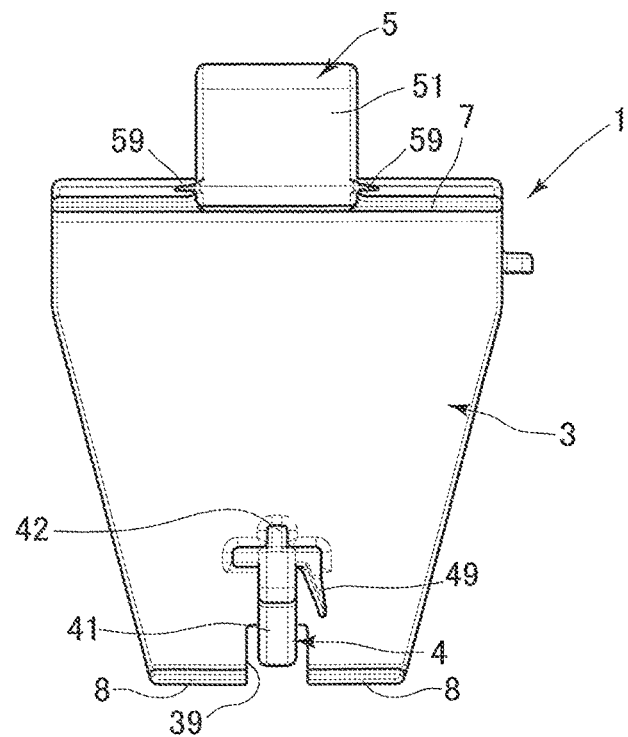
FIG. 9 is a back view of the bracket in FIG. 1.

In the assembled state (see FIG. 2), as shown in FIG. 7 and FIG. 8, the main surface opposed portion 3 has: a main surface 3*a* to face the main surface 101*b* of the case 101; rib-like abutting stopper portions 31 protruding from the main surface 3*a*; and elastic pressing pieces 32 obliquely extending from the main surface 3*a* to elastically press the main surface 101*b* of the assembled case 101.

Figure 11:
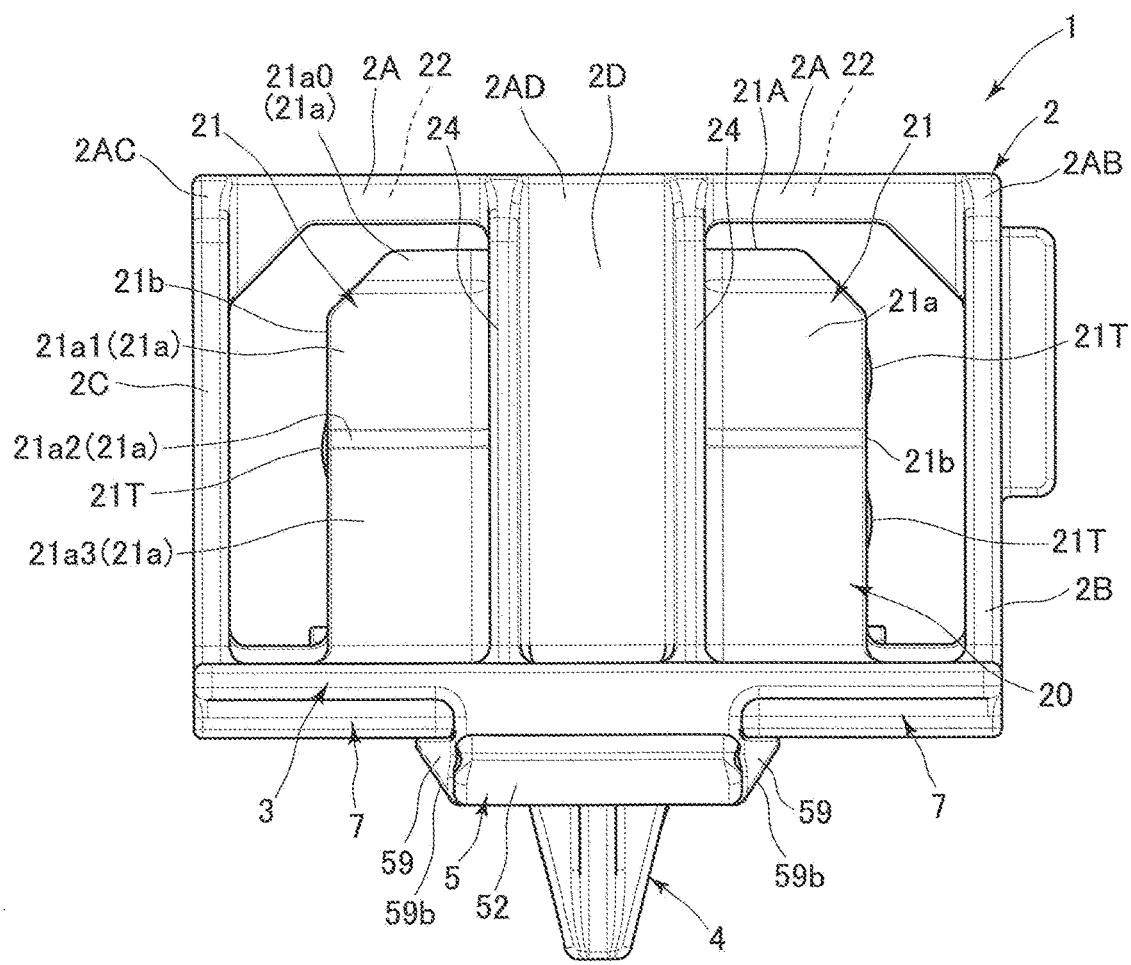
FIG. 11 is a plan view of the bracket in FIG. 1.

The side surface opposed portion 2 is formed to extend from the main surface opposed portion 3 toward the main surface 3*a* side in a direction 200Z (see FIG. 4) perpendicular to the main surface opposed portion 3. As shown in FIG. 11, in the assembled state (see FIG. 2), the side surface opposed portion 2 forms a frame shape having: an end frame portion 2A opposed, on the main surface 3*a* side, to the main surface opposed portion 3; a first side frame portion 2B connecting the end frame portion 2A and the main surface opposed portion 3, on one side in an outer circumferential direction S (see FIG. 21) of the case 101; a second side frame portion 2C connecting the end frame portion 2A and the main surface opposed portion 3, on the other side; and a central frame portion 2D connecting the end frame portion 2A and the main surface opposed portion 3, at the center in the outer circumferential direction S.

Figure 23:
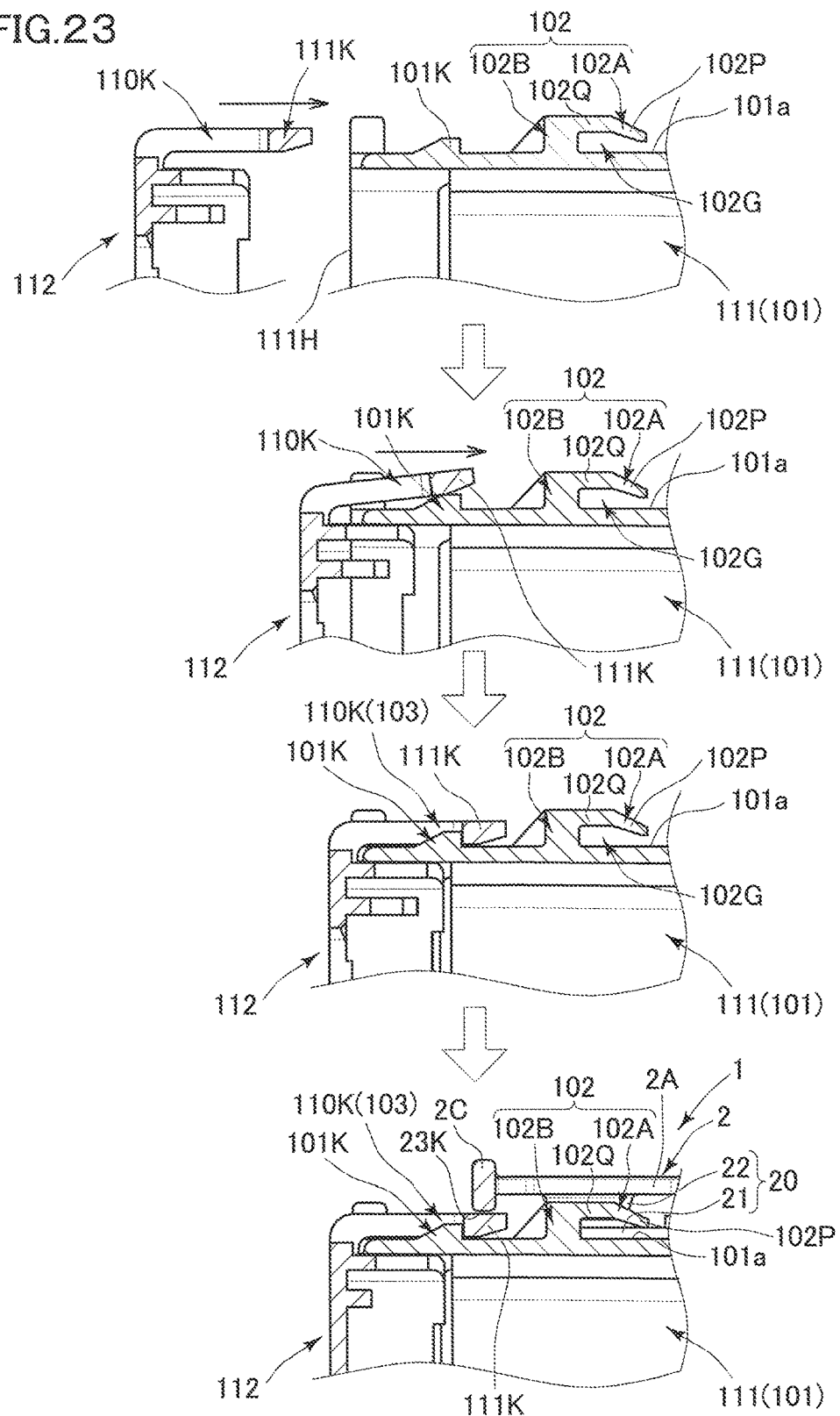
FIG. 23 illustrates an assembly method for assembling the cover to a body part in the case in FIG. 1, using a cross section along XXI-XXI line in FIG. 20.

As shown in FIG. 7 and FIG. 8, each assembly portion 20 has an insertion portion 21 and a detachment preventing latch portion 22. On the other hand, as shown in FIG. 23, the case 101 has, on its outer peripheral side surface 101*a*, assembly portions 102 forming a gap 102G into which the insertion portions 21 are inserted. The assembly portion 20 is assembled to the assembly portion 102 of the case 101 by the insertion portion 21 being inserted into the gap 102G.

Figure 22:
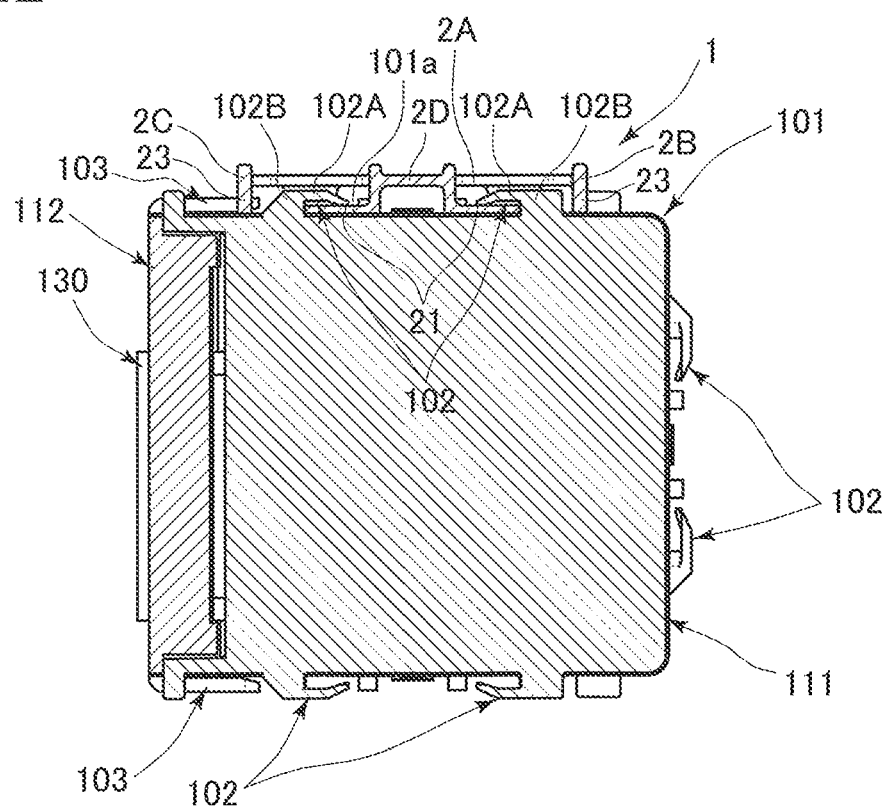
FIG. 22 is a sectional view along XXII-XXII line in FIG. 20.

As shown in FIG. 21 and FIG. 22, the assembly portions 102 of the case 101 are L-shaped opposed wall portions having: opposed wall portions 102B, 102B formed so as to protrude upward while being opposed to each other in the outer circumferential direction S (see FIG. 21) of the case 101, on the outer peripheral side surface 101a; and elastic pressing portions 102A, 102A bending from the distal end sides of the opposed wall portions 102B, 102B and extending in the outer circumferential direction of the case 101. As shown at the lowermost stage in FIG. 23, both elastic pressing portions 102A have: elastic base end portions 102Q extending from the opposed wall portions 102B in parallel with the outer peripheral side surface 101a in such directions as to approach each other; and elastic distal end portions 102P inclined from the distal end sides of the elastic base end portions 102Q toward the outer peripheral side surface 101a sides. The gap 102G into which the insertion portions 21 are inserted is formed between the opposed wall portions 102B, 102B opposed to each other (see FIG. 13) and between the outer peripheral side surface 101a and the elastic pressing portions 102A, 102A extending so as to approach each other (see FIG. 12A and FIG. 12B). Here, an insertion direction I of the insertion portions 21 into the gap 102G is defined as a direction that is parallel with the outer peripheral side surface 101a having the assembly portions 102 (elastic pressing portions 102A, 102A) on the case 101 and is perpendicular to the outer circumferential direction S (see FIG. 21). On the other hand, the insertion portions 21 are formed in a plate shape. When the insertion portions 21 are inserted into the gap 102G formed by the assembly portions 102 of the case 101, the insertion portions 21 come into a detachment prevented state with respect to the assembly portions 102, and as a result, the bracket 1 is assembled to the case 101 as shown in FIG. 2.

In the side surface opposed portion 2 of the bracket 1 in the assembled state, the insertion portions 21 are located on a side close to the outer peripheral side surface 101a of the case 101 (see FIG. 2), and are formed to extend from the main surface opposed portion 3 in a direction 200Z (see FIG. 12A) perpendicular thereto. As shown in FIG. 7 and FIG. 8, the insertion portions 21 are plate-shaped wall portions extending in such directions as to be separated from each other from the distal end sides of base end wall portions 24, 24 extending in the downward direction toward the outer peripheral side surface 101a of the case 101, on one side (i.e., first side frame portion 2B side) and the other side (i.e., second side frame portion 2C side) in the outer circumferential direction S (see FIG. 21) of the central frame portion 2D. On distal end surfaces 21b, 21b (which can be also said to be both side surfaces 21b, 21b of the insertion portions 21) at the extending ends of the insertion portions 21 extending in such directions as to be separated from each other, sliding projections 21T are formed as shown in FIG. 11.

Figure 13:
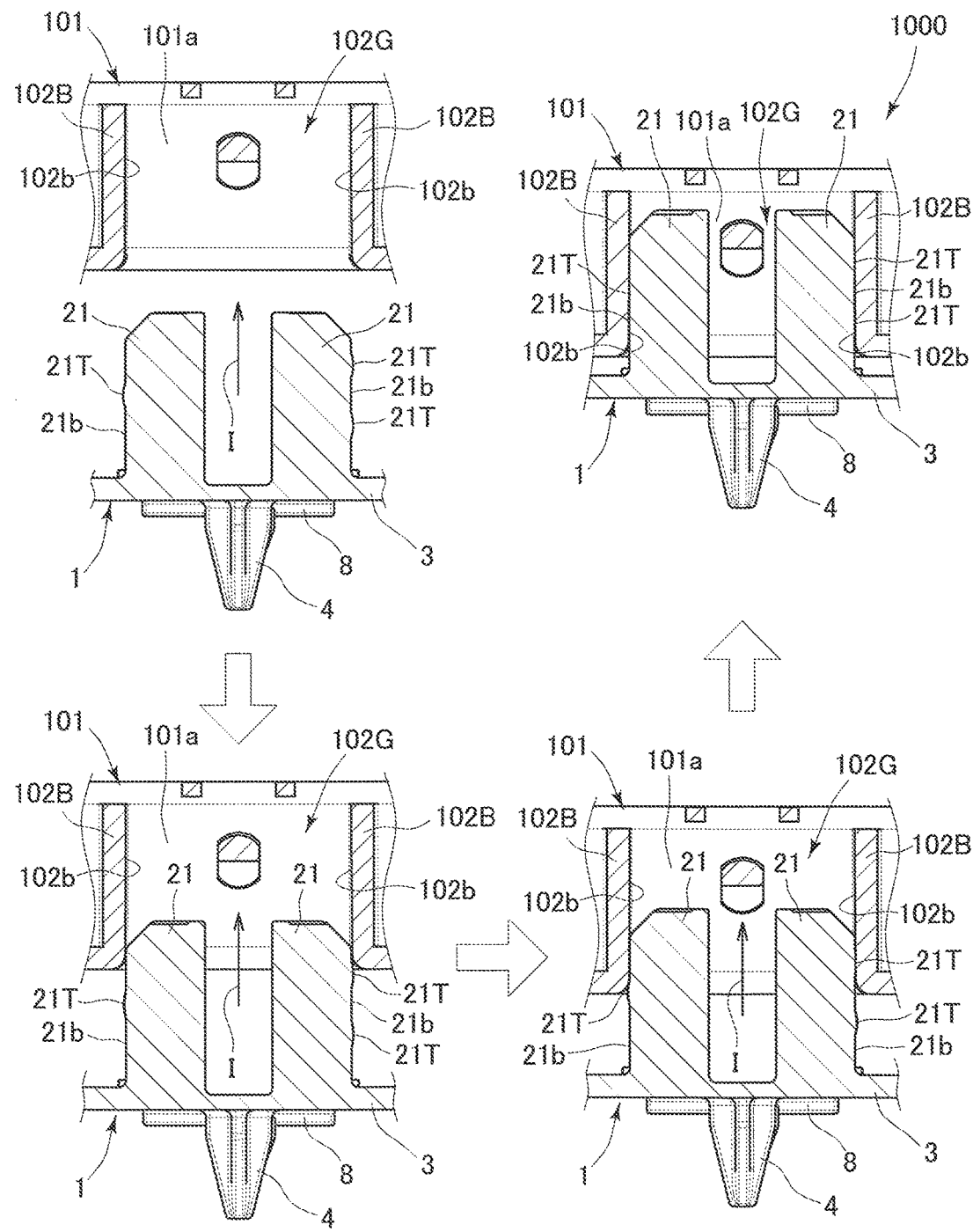
FIG. 13 illustrates the assembly method for assembling the bracket to the case in FIG. 1, using a cross section along XIII-XIII line in FIG. 4 without showing the panel member.

As shown in FIG. 11 and FIG. 13, the sliding projections 21T are arc-shaped protrusions protruding from both side surfaces 21b, 21b, of the insertion portions 21, which face the opposed wall portions 102B, 102B when the insertion portions 21 are inserted into the gap 102G. When the insertion portions 21 are inserted into the gap 102G, the sliding projections 21T are pressed to the opposed wall portions 102B, 102B in a form similar to point-to-point contact rather than surface-to-surface contact. Therefore, the contact area is small and the insertion resistance of the insertion portions 21 can be greatly reduced. Thus, assembly of the bracket 1 and the case 101 is facilitated.

Here, as shown in FIG. 11, two sliding projections 21T are formed on one side surface 21b (i.e., on the first side frame portion 2B side) of both side surfaces 21b, 21b, and one sliding projection 21T is formed on the opposite other side surface 21b (i.e., second side frame portion 2C side), and thus a total of three sliding projections 21T are formed. By the three sliding projections 21T contacting with the opposed wall portions 102B, 102B at three points, the bracket 1 assembled to the case 101 by insertion comes into a rattling prevented state in which movements in any directions on a plane passing through those three points relative to the case 101 are all restricted.

Figure 12A:
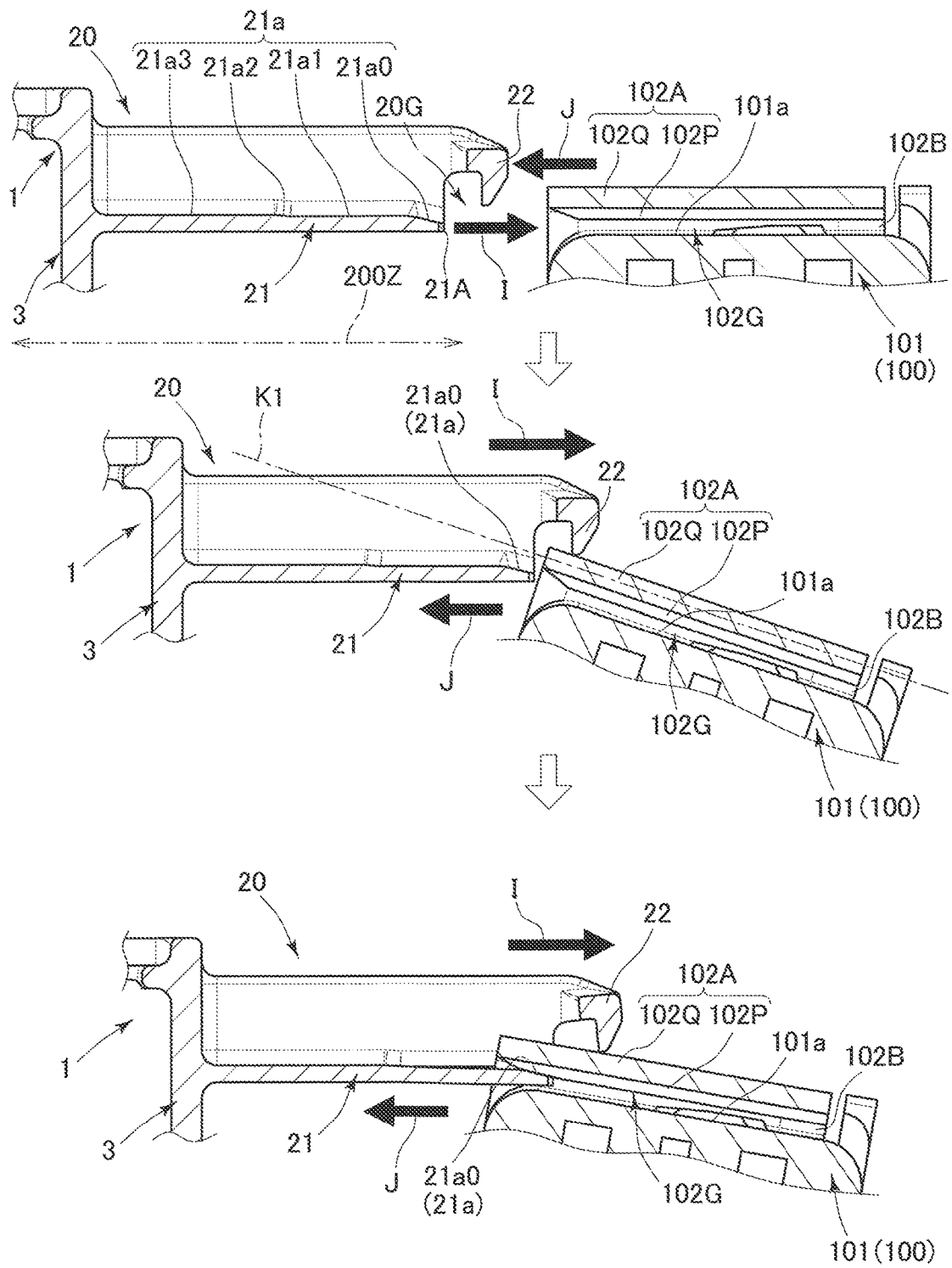
FIG. 12A illustrates an assembly method for assembling the bracket to the case in FIG. 1, using a cross section along XII-XII line in FIG. 10.

When the insertion portions 21 are inserted into the gap 102G, upper surfaces 21a of the insertion portions 21 are pressed downward by the elastic pressing portions 102A (see FIG. 23). Here, as shown in FIG. 12A, each upper surface 21a has: a rear-side upper surface 21a3 in the insertion direction I of the insertion portion 21; an intermediate slope surface 21a2 descending frontward in the insertion direction I from the rear-side upper surface 21a3; and a front-side upper surface 21a1 extending frontward in the insertion direction I from the intermediate slope surface 21a2 and thus located lower than the rear-side upper surface 21a3, and further has, on the front side in the insertion direction I of the front-side upper surface 21a1, a front-end upper surface 21a0 serving as a guide slope surface. When each insertion portion 21 is inserted into the gap 102G, the elastic pressing portion 102A slides on the upper surfaces 21a0, 21a1, 21a2, 21a3 sequentially from the front side to the rear side in the insertion direction I. Further, since the bottom surface of each insertion portion 21 opposite to the upper surface 21a is formed to be flat, the thickness of the insertion portion 21 decreases frontward in the insertion direction I in accordance with the upper surfaces 21a0, 21a1, 21a2, 21a3. It is noted that the upper surfaces 21a0, 21a1, 21a2, 21a3 may be formed at least in an area on which the elastic pressing portion 102A is to slide, and the remaining area may not be formed in such a shape. Here, of the insertion portion 21, a surface area to be opposed to the elastic base end portion 102Q is formed to have the same thickness as the upper surface 21a3 area which is the thickest.

As shown in FIG. 13, the sliding projections 21T are formed so as to appear alternately, in the insertion direction I, on both side surfaces 21b, 21b of the insertion portions 21. Here, as shown in FIG. 11, one sliding projection 21T is formed in a zone corresponding to the front-side upper surface 21a1 on one side surface 21b of the insertion portion 21, one sliding projection 21T is formed in a zone corresponding to the intermediate slope surface 21a2 on the other side surface 21b of the insertion portion 21, and one sliding projection 21T is formed in a zone corresponding to the rear-side upper surface 21a3 on the one side surface 21b of the insertion portion 21.

As shown in FIG. 11 and FIG. 12A, in the side surface opposed portion 2, the detachment preventing latch portions 22 are formed on the front side in the insertion direction I of the insertion portions 21 and protrude downward so as to approach the outer peripheral side surface 101a of the case 101. In the side surface opposed portion 2, the insertion portions 21 are located lower than the detachment preventing latch portions 22, and front-side end portions 21A in the insertion direction I of the insertion portions 21 are located on the rear side in the insertion direction I with respect to the detachment preventing latch portions 22.

Figure 10:
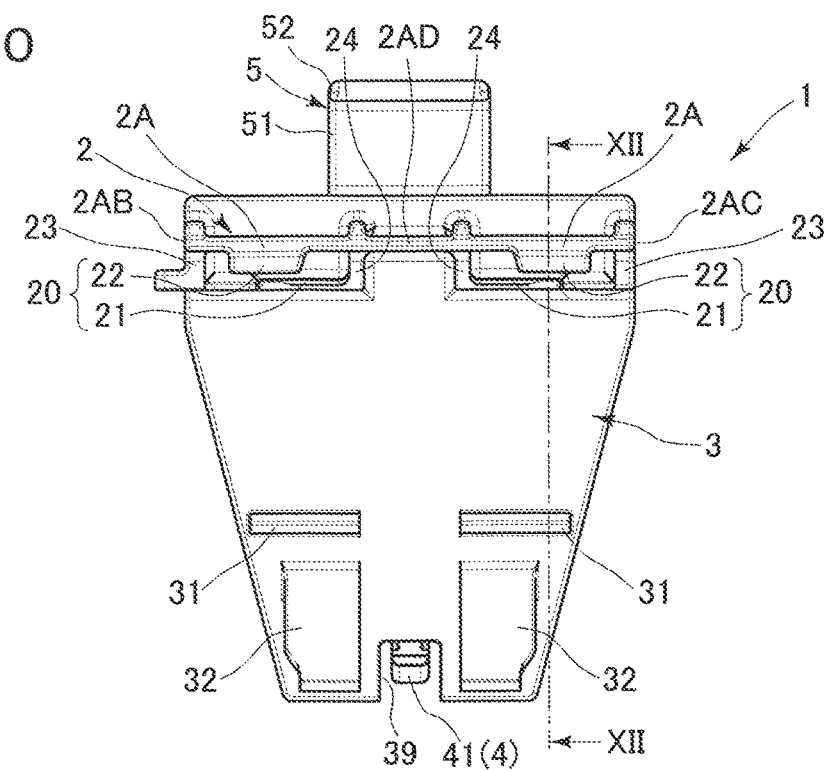
FIG. 10 is a front view of the bracket in FIG. 1.

Here, as shown in FIG. 8, the detachment preventing latch portions 22 are formed so as to protrude downward on the end frame portion 2A of the side surface opposed portion 2. Specifically, as shown in FIG. 11, FIG. 7, and FIG. 8, the detachment preventing latch portions 22 are formed, on the end frame portion 2A, in zones between a central connection portion 2AD connected with the central frame portion 2D and side connection portions 2AB, 2AC connected with the side frame portions 2B, 2C. More specifically, as shown in FIG. 10, the detachment preventing latch portions 22 are formed at the centers of the zones between the central connection portion 2AD and the side connection portions 2AB, 2AC on the end frame portion 2A. On the other hand, on both sides of the center of each zone, the detachment preventing latch portions 22 are not formed, and these parts where the detachment preventing latch portions 22 are not formed are weak portions 2AE, 2AE (see FIG. 14). That is, in the central zones where the detachment preventing latch portions 22 are formed and both end zones where the connection portions 2AB, 2AC, 2AD with the other frame portions 2B, 2C, 2D are formed, the end frame portion 2A is formed as a high-rigidity portion having high rigidity, whereas in the zones where the detachment preventing latch portions 22 and the connection portions 2AB, 2AC, 2AD are not formed, the end frame portion 2A is formed as a weak portion 2AE which has lower rigidity than the high-rigidity portion and is easily elastically deformed.

In the assembled state (see FIG. 2) with the case 101, the detachment preventing latch portions 22 are latched with the assembly portions 102 serving as predetermined latch portions on the case 101, thereby retaining the case 101 in a detachment prevented state. Specifically, when the insertion portions 21 are inserted to a predetermined assembled position in the gap 102G between the elastic pressing portions 102A and the outer peripheral side surface 101a, each detachment preventing latch portion 22 goes over the elastic pressing portion 102A to the front side thereof in the insertion direction I of the insertion portion 21, so as to be latched with a front-side end surface 102a of the elastic pressing portion 102A (see lower stage in FIG. 12B).

As described above, by inserting the insertion portions 21 into the gap 102G formed by the assembly portions 102 forming the L-shaped opposed wall portions on the outer peripheral side surface 101a of the case 101, a detachment prevented state is established in which the assembly portions 102 are latched by the detachment preventing latch portions 22, whereby the bracket 1 is assembled to the case 101.

Here, an assembling method and the assembly structure 1000 for the bracket 1 and the case 101 (ECU 100) by the assembly portions 20 will be specifically described.

Figure 12B:
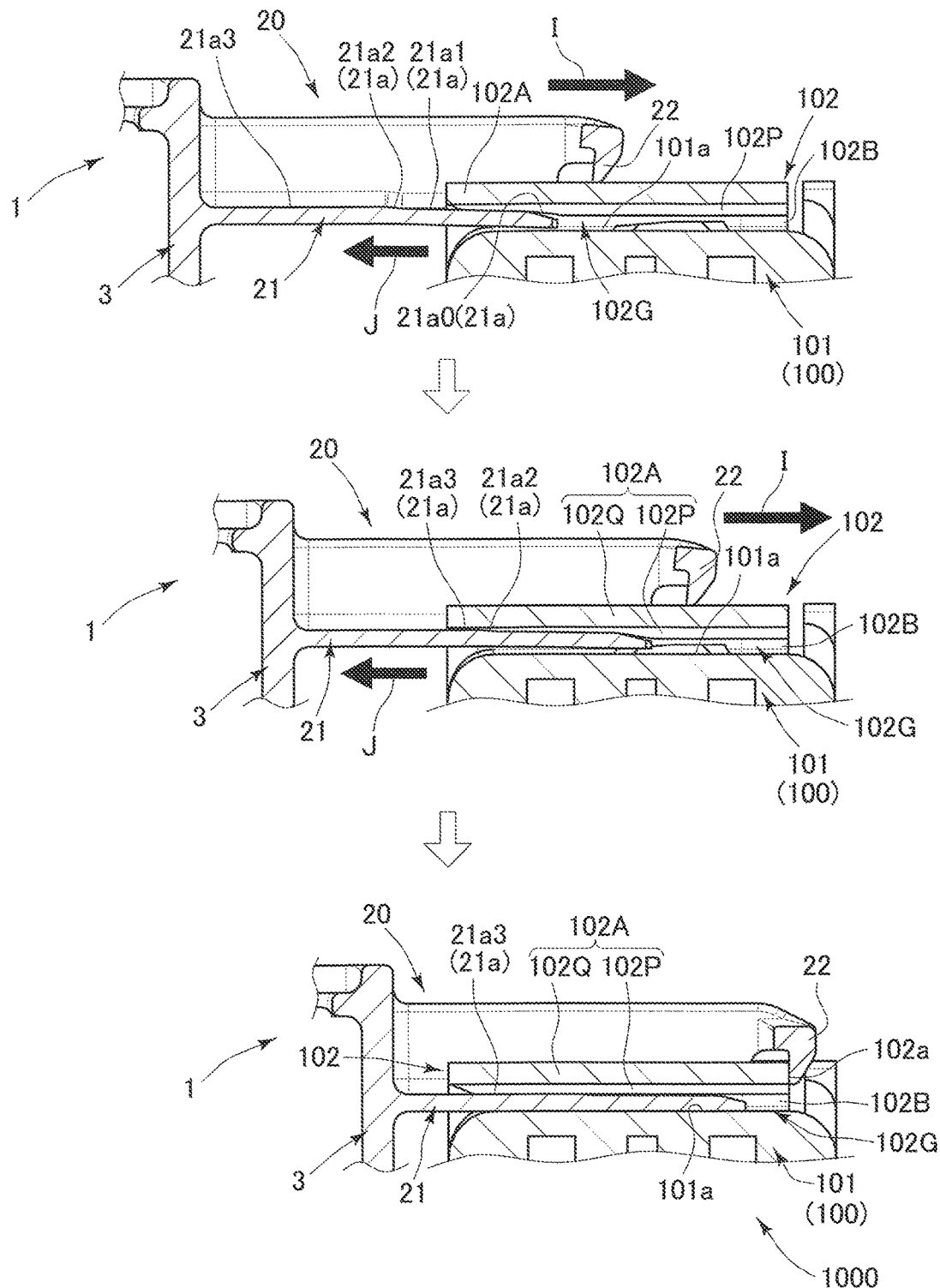
FIG. 12B is a view that follows the view in FIG. 12A.

As described above, assembly between the bracket 1 and the case 101 is performed by inserting each insertion portion 21 of the bracket 1 into the gap 102G (first opposition clearance) provided in the assembly portion 102 of the case 101, as shown in FIG. 12A, FIG. 12B, and FIG. 13. Here, at the time of the insertion, the elastic pressing portion 102A forming the gap 102G of the case 101 needs to pass through an opposition clearance 20G (second opposition clearance: see upper stage in FIG. 12A) between the detachment preventing latch portion 22 and the insertion portion 21 of the bracket 1. However, as shown at the upper stage in FIG. 12A, even if the insertion portion 21 of the bracket 1 is attempted to be directly inserted into the gap 102G of the case 101, the detachment preventing latch portion 22 of the bracket 1 comes into contact with the elastic pressing portion 102A of the case 101, so that the elastic pressing portion 102A of the case 101 cannot enter the opposition clearance 20G of the bracket 1. Therefore, the insertion portion 21 of the bracket 1 also cannot enter the gap 102G of the case 101, and the bracket 1 and the case 101 cannot be assembled.

However, as shown at the middle stage and the lower stage in FIG. 12A, when the assembly portion 20 of the bracket 1 in the contact state is pressed to the elastic pressing portion 102A of the case 101 and thereby one or more of the side surface opposed portion 2, the assembly portion 20, and the elastic pressing portion 102A are elastically deformed, the elastic pressing portion 102A of the case 101 is allowed to enter the opposition clearance 20G (second opposition clearance) of the bracket 1, and thus the insertion portion 21 of the bracket 1 is also allowed to be inserted into the gap 102G (first opposition clearance) of the case 101. Specifically, mainly the following three elastic deformations occur, so that the elastic pressing portion 102A is allowed to enter the opposition clearance 20G.

Figure 14:
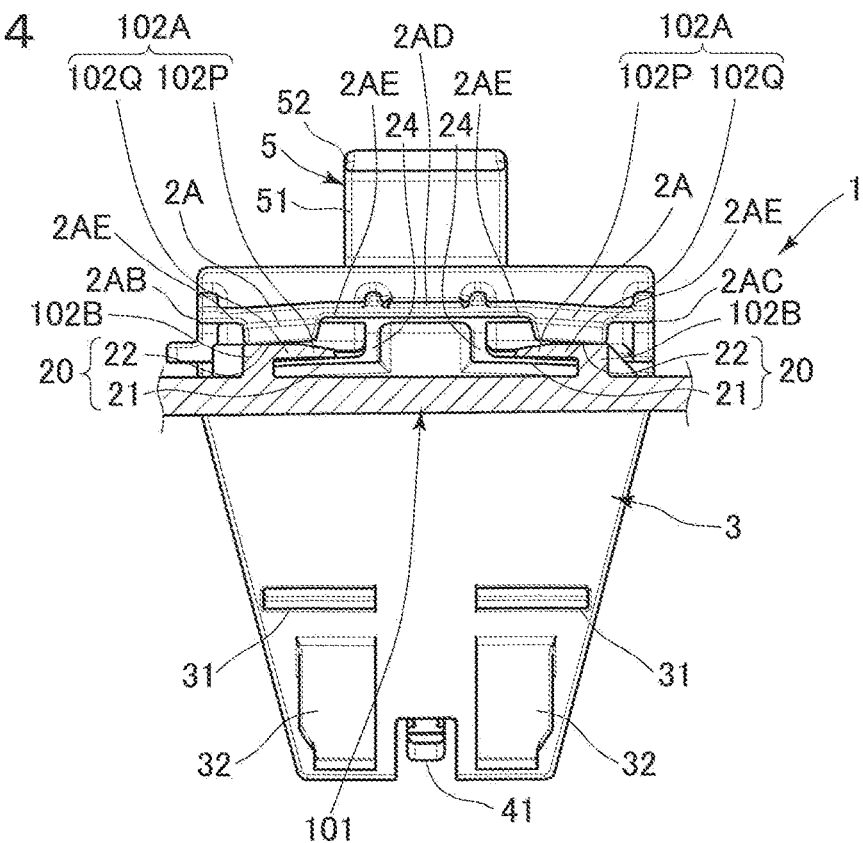
FIG. 14 is a sectional view showing elastic deformation of the bracket when the bracket is assembled to the case in FIG. 1, as seen from the front side of the bracket.

The first elastic deformation is elastic deformation of the side surface opposed portion 2, and is elastic deformation in which each detachment preventing latch portion 22 of the bracket 1 moving in the insertion direction I is pushed up by the elastic pressing portion 102A as shown in FIG. 14. The first elastic deformation occurs at the weak portions 2AE, 2AE on both sides of the detachment preventing latch portion 22 in the end frame portion 2A, and by the weak portions 2AE being elastically deformed, the center of the end frame portion 2A is pushed up. As a result, the opposition clearance 20G (see FIG. 12A) between the detachment preventing latch portion 22 and the insertion portion 21 of the bracket 1 expands, so that it becomes easy for the elastic pressing portion 102A to enter the opposition clearance 20G.

The second elastic deformation is elastic deformation of the elastic pressing portion 102A, and is elastic deformation in which the elastic distal end portion 102P on the distal end side of the elastic pressing portion 102A is pushed up by the insertion portion 21 of the bracket 1 going into the underside thereof as shown at the lower stage in FIG. 12A. The second elastic deformation occurs at the elastic distal end portion 102P formed as an inclined piece extending downward on the distal end side of the elastic pressing portion 102A. In the elastic pressing portion 102A, by the elastic distal end portion 102P being pushed up, the entire elastic pressing portion 102A including the elastic base end portion 102Q becomes close to a straight shape and the width thereof in the thickness direction is narrowed. As a result, the elastic pressing portion 102A becomes such a shape that can easily enter the opposition clearance 20G between the detachment preventing latch portion 22 and the insertion portion 21 of the bracket 1.

The third elastic deformation is elastic deformation of the assembly portion 20, and is elastic deformation in which the insertion portion 21 of the bracket 1 is pushed down by the elastic pressing portion 102A as shown at the lower stage in FIG. 12A. The third elastic deformation occurs from the front side in the insertion direction I in the insertion portion 21. The insertion portion 21 is pushed down from the front side in the insertion direction I with which the elastic distal end portion 102P comes into contact, and thus the opposition clearance 20G between the detachment preventing latch portion 22 and the insertion portion 21 of the bracket 1 expands, so that it becomes easy for the elastic pressing portion 102A to enter the opposition clearance 20G. The front side in the insertion direction I of the insertion portion 21, which first comes into contact with the elastic pressing portion 102A, is a relatively thin part (see upper stage in FIG. 12A) where the upper surfaces 21a0, 21a1 are formed, and therefore is easily elastically deformed.

The procedure for causing the first, second, and third elastic deformations will be described.

As shown at the middle stage in FIG. 12A, the elastic pressing portion 102A is caused to enter in the direction opposite to the insertion direction I of the insertion portion 21 through the opposition clearance 20G (second opposition clearance) between the upper-side detachment preventing latch portion 22 and the lower-side insertion portion 21 of the bracket 1, and then is received to the back side of the opposition clearance 20G. In this reception, the case 101 is inclined relative to the bracket 1 so that the front side in a receiving direction J (opposite to insertion direction I) is up and the rear side is down. Then, the inclined case 101 is moved in an inclination direction K1 thereof toward the receiving direction J side, to cause the elastic pressing portion 102A to enter the second opposition clearance 20G. That is, the elastic pressing portion 102A is caused to approach the opposition clearance 20G so as to move obliquely upward (in the drawing, upper-left direction) from the lower side of the detachment preventing latch portion 22.

Thus, as shown at the lower stage in FIG. 12A, the elastic pressing portion 102A comes into contact with the front-end upper surface 21a0 of the insertion portion 21. Here, the front-end upper surface 21a0 of the insertion portion 21 is formed as the guide slope surface descending toward the front side in the insertion direction I. Therefore, when the elastic pressing portion 102A has come into contact with the front-end upper surface 21a0, if the insertion portion 21 is pushed into the far side in the insertion direction I, the elastic pressing portion 102A directly slides on the front-end upper surface 21a0 in the receiving direction J. At this time, the elastic pressing portion 102A pushes down the front-end upper surface 21a0 on which the elastic pressing portion 102A is sliding, and pushes up the detachment preventing latch portion 22 located on the upper side. Thus, the first and third elastic deformations (see lower stage in FIG. 12A, and FIG. 14) occur, so that the opposition clearance 20G of the bracket 1 is expanded.

Meanwhile, as shown in FIG. 14, the elastic pressing portion 102A at this time undergoes downward pressing to the elastic base end portion 102Q from the detachment preventing latch portion 22 located on the upper side, and upward pressing to the elastic distal end portion 102P from the insertion portion 21 located on the lower side, whereby the second elastic deformation occurs in which the elastic base end portion 102Q on the base end side is lowered and the elastic distal end portion 102P on the distal end side is pushed upward. As a result, the width in the thickness direction of the entire elastic pressing portion 102A is reduced. The elastic pressing portion 102A having a reduced width in the thickness direction is allowed to enter into the back side of the opposition clearance 20G even if the first and third elastic deformations to expand the opposition clearance 20G of the bracket 1 do not occur so greatly.

In this way, reception of the elastic pressing portion 102A into the opposition clearance 20G (second opposition clearance) of the bracket 1 is enabled and the elastic pressing portion 102A is moved in the receiving direction J to enter into the back side of the opposition clearance 20G (second opposition clearance), whereby the insertion portion 21 of the bracket 1 is inserted into the gap 102G (first opposition clearance) of the case 101. As shown in FIG. 13, insertion of the insertion portions 21 of the bracket 1 into the gap 102G is performed while the sliding projections 21T formed on both side surfaces 21b, 21b of the insertion portions 21 slide on inner side wall surfaces 102b of the opposed wall portions 102B, 102B of the case 101. Further, as shown at the middle stage and the lower stage in FIG. 12B and FIG. 14, the insertion of the insertion portions 21 into the gap 102G is performed while the elastic pressing portions 102A of the case 101 are pressed to the upper surfaces 21a of the insertion portions 21 and slide on the upper surfaces 21a.

Thereafter, as shown at the lower stage in FIG. 12B and the upper right stage in FIG. 13, when the entire elastic pressing portions 102A have passed by the detachment preventing latch portions 22 and the reception is completed, the first to third elastic deformations are all released (i.e., elastic restoration) and the insertion portions 21 reach a predetermined assembled position. Thus, the bracket 1 is assembled to the case 101. Specifically, by the first elastic deformation being released, each detachment preventing latch portion 22 goes over the elastic pressing portion 102A to the front side thereof in the insertion direction I so as to be latched, and thus a detachment prevented state is established in which the elastic pressing portion 102A is prevented from being detached in the insertion direction I (i.e., frontward in the insertion direction I). Thus, the bracket 1 is assembled to the case 101.

Here, when the detachment prevented state is established, the above second and third elastic deformations relevant to the elastic pressing portions 102A are completely released, but the elastic pressing portions 102A are in contact with the upper surfaces 21a (specifically, rear-side upper surfaces 21a3) of the insertion portions 21. However, in the detachment prevented state, one or both of the second elastic deformation and the third elastic deformation may slightly remain.

The bracket 1 that has come into the detachment prevented state with respect to the case 101 as described above is retained at the predetermined assembled position as shown in FIG. 4. In the bracket 1 retained at the assembled position, the main surface opposed portion 3 can be caused to further approach the case 101 side over the assembled position. However, this approaching is restricted by the abutting stopper portions 31 and the elastic pressing pieces 32 formed on the main surface opposed portion 3 of the bracket 1.

In the detachment prevented state, each abutting stopper portion 31 is close to and opposed to the main surface 101b of the case 101 which faces the main surface opposed portion 3 of the bracket 1. When the bracket 1 excessively moves to the far side in the insertion direction I, the abutting stopper portion 31 comes into contact with the main surface 101b, thereby restricting further movement.

In the detachment prevented state, each elastic pressing piece 32 is elastically deformed so as to constantly press, in the insertion direction I, the main surface 101b of the case 101 which faces the main surface opposed portion 3 of the bracket 1 (see FIG. 4). Thus, the case 101 is retained in a state in which the assembly portion 102 (here, the elastic pressing portion 102A) is latched (contacts) with the detachment preventing latch portion 22.

Next, the insertion resistance when the insertion portions 21 of the bracket 1 are inserted into the gap 102G of the case 101 as described above will be described.

Figure 15:
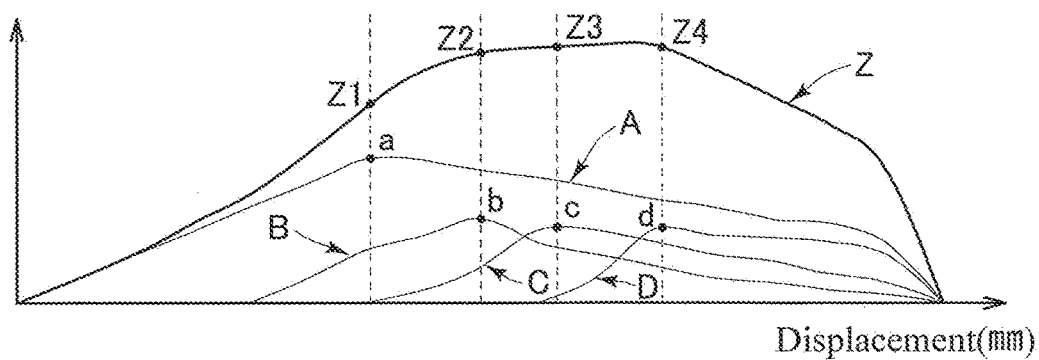
FIG. 15 is a graph showing change in an insertion resistance value which changes as assembly progresses by insertion, when the bracket is assembled to the case in FIG. 1.

As shown by curve Z in FIG. 15, the insertion resistance occurring due to insertion of the insertion portions 21 into the gap 102G reaches the first peak Z1 when the first to third elastic deformations occur. Then, the second peak Z2 is reached when the second sliding projection 21T of the insertion portions 21 enters the gap 102G, the third peak Z3 is reached when the elastic pressing portions 102A of the case 101 ride onto the rear-side upper surfaces 21a3 from the intermediate slope surfaces 21a2, and the fourth peak Z4 is reached when the third sliding projection 21T of the insertion portions 21 enters the gap 102G.

In FIG. 15, the curve A represents the value of insertion resistance caused by the first to third elastic deformations, the curve B represents the value of insertion resistance caused by the second sliding projection 21T entering the gap 102G, the curve C represents the value of insertion resistance caused by the elastic pressing portions 102A riding onto the rear-side upper surfaces 21a3 from the intermediate slope surface 21a2, the curve D represents the value of insertion resistance caused by the third sliding projection 21T entering the gap 102G, and the curve Z represents the value of insertion resistance obtained by synthesizing these insertion resistance values. Each curve A, B, C, D, Z is shown in a simple manner so as to reflect the respective insertion resistance tendencies, and do not reflect specific insertion resistance values.

As shown by the curve A in FIG. 15, the insertion resistance caused by the first to third elastic deformations increases as the elastic pressing portions 102A of the case 101 slide on the front-end upper surfaces 21a0 of the insertion portions 21 of the bracket 1, and reaches a peak a when the elastic pressing portions 102A reach the front-side upper surfaces 21a1. Thereafter, the insertion resistance mildly decreases. The peak a of the insertion resistance due to the first to third elastic deformations corresponds to a time when, as shown in FIG. 14, the elastic pressing portions 102A become able to enter the opposition clearances 20G between the detachment preventing latch portions 22 and the insertion portions 21, i.e., when the first and second elastic deformations occur with the maximum displacements. Thereafter, the bracket 1 continues to be subjected to drag resistance by the insertion portions 21 sliding through the gap 102G of the case 101, while keeping the elastic deformed state.

As shown by the curve B in FIG. 15, insertion resistance caused by the second sliding projection 21T reaches a peak b when the second sliding projection 21T counted from the front side in the insertion direction I among the sliding projections 21T formed alternately in the insertion direction I on both side surfaces 21b, 21b of the insertion portions 21 of the bracket 1 enters the gap 102G of the case 101 (see lower right stage in FIG. 13), and thereafter mildly decreases. In the insertion portions 21 of the bracket 1, when the first sliding projection 21T counted from the front side in the insertion direction I enters the gap 102G (see lower left stage in FIG. 13), the sliding projection 21T on the side surface 21b opposite to the side surface 21b on which the first sliding projection 21T is formed has not entered the gap 102G yet. Therefore, at this stage, the insertion portions 21 can enter the gap 102G with a margin. However, the second sliding projection 21T counted from the front side in the insertion direction I is a projection formed on the side surface 21b opposite to the first sliding projection 21T, and when this second sliding projection 21T enters the gap 102G, sliding resistance occurs in such a manner that the first and second sliding projections 21T, 21T on both sides are both crushed. Also in the case of this sliding resistance, after the peak b is reached when the second sliding projection 21T enters the gap 102G, drag resistance continues to act while these sliding projections 21T, 21T of the insertion portions 21 are sliding.

As shown in the curve C in FIG. 15, insertion resistance caused when the elastic pressing portions 102A of the case 101 are to ride onto the rear-side upper surfaces 21a3 from the intermediate slope surfaces 21a2 increases as the elastic pressing portions 102A of the case 101 sliding on the upper surfaces 21a of the insertion portions 21 of the bracket 1 approach the rear-side upper surfaces 21a3, on the intermediate slope surfaces 21a2. Then, when the elastic pressing portions 102A ride onto the rear-side upper surfaces 21a3, the insertion resistance reaches a peak c and thereafter, mildly decreases. Here, since the rear-side upper surfaces 21a3 are located on the rear side in the insertion direction I relative to the second sliding projection 21T, the peak c occurs after the peak b. The peak c of the insertion resistance due to the intermediate slope surfaces 21a2 and the rear-side upper surfaces 21a3 corresponds to a time when the second elastic deformation of the elastic pressing portions 102A of the case 101 occurs with the maximum displacement. Thereafter, drag resistance continues to act by the elastic pressing portions 102A sliding on the rear-side upper surfaces 21a3 while the above elastically deformed state is kept.

As shown by the curve D in FIG. 15, insertion resistance caused by the third sliding projection 21T reaches a peak d when the third sliding projection 21T counted from the front side in the insertion direction I among the sliding projections 21T formed alternately in the insertion direction I on both side surfaces 21b, 21b of the insertion portions 21 of the bracket 1 enters the gap 102G of the case 101 (see upper right stage in FIG. 13), and thereafter mildly decreases. When the second sliding projection 21T counted from the front side in the insertion direction I enters the gap 102G (see lower right stage in FIG. 13), the insertion portions 21 of the bracket 1 are in such a condition as to rattle in a direction inclined with respect to the insertion direction I, but when the third sliding projection 21T enters the gap 102G (see upper right stage in FIG. 13), a rattling prevented state is established by three-point contact and thus the insertion attitude is fixed. After the sliding resistance reaches the peak d when the third sliding projection 21T enters the gap 102G, drag resistance continues to act by all the sliding projections 21T sliding.

The insertion resistance (curve Z) over the entire range when the insertion portions 21 of the bracket 1 are inserted into the gap 102G of the case 101 almost coincides with a shape obtained by synthesizing the above four insertion resistances (curves A, B, C, D). In this embodiment, when these four insertion resistances (curves A, B, C, D) are synthesized, the positions of the peaks a, b, c, d in the insertion direction I are set to be different from each other. Thus, the entire insertion resistance (curve Z) has no section in which peaks overlap and the insertion resistance greatly increases.

It is noted that, other than the above insertion resistances (curves A, B, C, D), there are elements that cause change in the entire insertion resistance (curve Z), but such elements have less influence than the above insertion resistances (curves A, B, C, D) and therefore are omitted.

Next, a method for detaching the assembled bracket 1 and case 101 (ECU 100) from each other and the assembly structure 1000 for the bracket 1 and the case 101 (ECU 100) that enables the detachment will be specifically described with reference to FIG. 16 and FIG. 17.

The detachment direction of the case 101 with respect to the bracket 1 is the same direction as the insertion direction I of the insertion portions 21 described above. Therefore, here, the detachment direction is denoted by the same reference character and thus referred to as detachment direction I. The receiving direction J of the elastic pressing portions 102A described above is opposite to the detachment direction I. The insertion direction I can be also said to be the assembly direction of the bracket 1 to the case 101.

Figure 16:
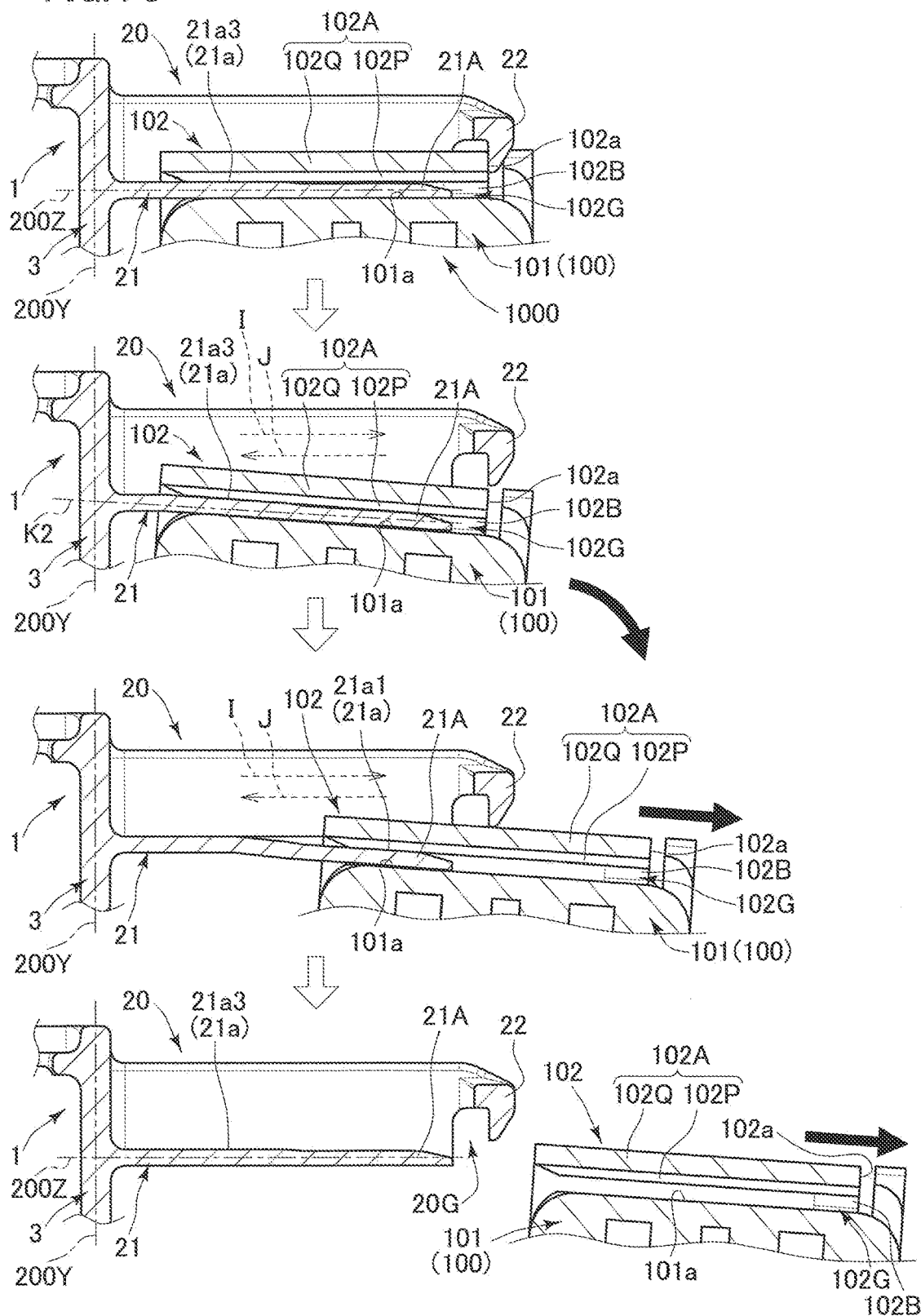
FIG. 16 illustrates a method for detaching the bracket from the case in FIG. 2, using a cross section along XII-XII line in FIG. 10.

The assembled bracket 1 and case 101 are in a detachment prevented state in which each detachment preventing latch portion 22 has come over the elastic pressing portion 102A to the front side thereof in the detachment direction of the case 101 so as to be latched (see first stage (uppermost stage) in FIG. 16). In order to release the detachment prevented state and detach the case 101 from the bracket 1, first, the case 101 is inclined relative to the bracket 1 so that the rear side (left side in FIG. 16) in the detachment direction I of the elastic pressing portion 102A is up and the front side (right side in FIG. 16) in the detachment direction I is down (see second stage in FIG. 16, and FIG. 17). At this time, the elastic pressing portion 102A presses down the front side (i.e., opposition clearance 20G side) in the detachment direction I of the insertion portion 21. Thus, the front side in the detachment direction I of the insertion portion 21 is elastically pushed down, so that the opposition clearance 20G (second opposition clearance) is expanded. The case 101 inclined relative to the bracket 1 is moved in an inclination direction K2 thereof toward the front side in the detachment direction I, thereby allowing the elastic pressing portion 102A to enter the opposition clearance 20G (second opposition clearance) (see third stage in FIG. 16). That is, the state in which the elastic pressing portion 102A is latched by the detachment preventing latch portion 22 is released. Then, the elastic pressing portion 102A passes by the detachment preventing latch portion 22, whereby detachment of the case 101 from the bracket 1 is completed (see fourth stage (lowermost stage) in FIG. 16). After the detachment is completed, the insertion portion 21 that has been pushed down is elastically restored to its original position.

Figure 17:
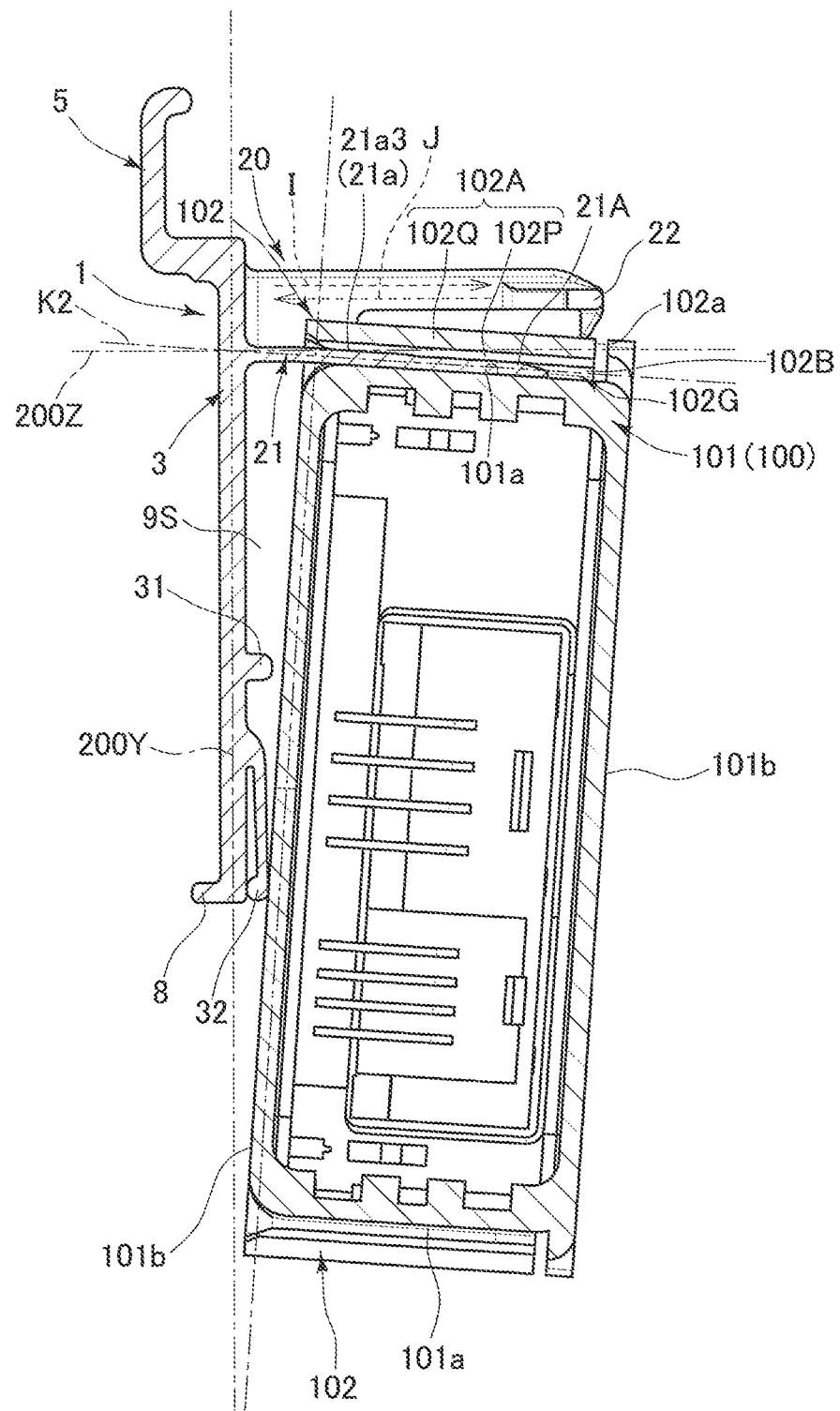
FIG. 17 is a sectional view showing the inclined attitude of the case when the bracket is detached from the case in FIG. 16.

In this way, from the bracket 1 assembled to the case 101 in a detachment prevented state, the case 101 (ECU 100) can be easily detached by inclining the case 101 as shown in FIG. 17. This inclination can be made owing to the presence of a space 9S formed between the case 101 and the main surface opposed portion 3 of the bracket 1. In a state in which the bracket 1 and the case 101 are assembled, the elastic pressing pieces 32 of the bracket 1 press the case 101 in the direction opposite to the receiving direction J, whereby the space 9S is formed between the main surface opposed portion 3 and the case 101 opposed to each other. The inclination of the case 101 is made by causing the case 101 to enter the space 9S (more specifically, a side (lower side in FIG. 17) of the space 9S that is far from the assembly portion 20 side). Also in the case of assembling the bracket 1 and the case 101, the case 101 is inclined relative to the bracket 1 (the middle stage in FIG. 12A), and the inclination in this case is also made by using a space corresponding to the space 9S.

The inclination directions K1, K2 shown in the drawings may be set such that the first side (lower side in FIG. 17) of the main surface opposed portion 3 in a direction 200Y in which latch portions 4, 5 are opposed to each other (hereinafter, referred to as latch portion opposition direction 200Y) becomes closer to the main surface opposed portion 3, and the opposite second side (upper side in FIG. 17) is separated from the main surface opposed portion 3, in order to allow assembly and detachment of the bracket 1 with respect to the case 101. Thus, the inclination directions K1, K2 are not predetermined fixed directions. The inclination directions K1, K2 shown in FIG. 12A, FIG. 16, FIG. 17 are examples of inclination directions needed for assembly/detachment of the bracket 1 with respect to the case 101, and the inclination angles thereof may be different from those shown in the drawings, depending on the amount of elastic deformation of each part of the assembly portions 20. In addition, each inclination angle may vary during assembly/detachment of the bracket 1 with respect to the case 101. Also, it is not necessary that the inclination directions K1, K2 coincide with each other.

As shown in FIG. 7 and FIG. 8, the main surface opposed portion 3 has: the main surface 3a to face the main surface 101b of the case 101 in the above-described assembled state (see FIG. 2); the rib-like abutting stopper portions 31 protruding from the main surface 3a; and the elastic pressing pieces 32 obliquely extending from the main surface 3a to elastically press the main surface 101b of the assembled case 101.

Here, the bracket body 10 in this embodiment has abutting wall portions 23, 23 as shown in FIG. 7 and FIG. 8.

The abutting wall portions 23, 23 are wall portions extending from the side surface opposed portion 2 toward the outer peripheral side surface 101a of the case 101, at positions on both outer sides of the insertion portions 21 in the outer circumferential direction S of the case 101, in the assembled state (see FIG. 2) of the bracket 1 and the case 101, and are located so as to come into contact with the outer peripheral side surface 101a. Here, the abutting wall portions 23, 23 are formed at the first side frame portion 2B and the second side frame portion 2C, respectively. In the insertion structure (i.e., insertion portion 21 and assembly portion 102) for assembling the case 101 and the bracket 1 as described above, there is a possibility that the bracket 1 rattles by being rocked in the outer circumferential direction S (see FIG. 21) with respect to the case 101. In this regard, the abutting wall portions 23, 23 are provided so as to sandwich both assembly portions 102 of the case 101 and are to have contact with the outer peripheral side surface 101a of the case 101, whereby rocking of the bracket 1 in the outer circumferential direction S can be prevented.

Here, the abutting wall portions 23, 23 are wall portions extending downward from the first side frame portion 2B and the second side frame portion 2C of the side surface opposed portion 2 by such a length as to come into contact with the outer peripheral side surface 101a of the case 101. In addition, here, the abutting wall portions 23, 23 are formed along the longitudinal directions on the first side frame portion 2B and the second side frame portion 2C. Thus, it is ensured that the abutting wall portions 23, 23 have wider contact areas with the outer peripheral side surface 101a of the case 101 along the longitudinal direction, whereby rocking in the outer circumferential direction S is suppressed. In addition, the abutting wall portions 23, 23 are connected with the main surface opposed portion 3 and therefore have high rigidity, whereby rocking in the outer circumferential direction S can be more stably suppressed.

One of the abutting wall portions 23, 23 has a cutout portion 23K as shown in FIG. 7 and FIG. 8.

The case 101 has a protrusion 103 (see FIG. 1) protruding outward, at a position corresponding to the one of the abutting wall portions 23 on the outer peripheral side surface 101a, and the cutout portion 23K is formed so as not to interfere with the protrusion 103 when the bracket 1 is assembled to the case 101. Thus, at the time of assembling the bracket 1 to the case 101, unless the position of the protrusion 103 of the case 101 and the position of the cutout portion 23K of the bracket 1 are matched with each other, the abutting wall portion 23 and the protrusion 103 interfere with each other and thus the assembly cannot be performed. Here, as shown in FIG. 18, the assembly portions 102 to be assembled with the bracket 1 are provided at a plurality of locations on the case 101. Specifically, the assembly portions 102 are provided correspondingly for the three outer peripheral side surfaces 101a.

It is noted that the protrusions 103 are formed by assembly portions 110K provided to the cover 112 of the case 101, as shown in FIG. 18 and FIG. 19. Here, the case 101 is formed by assembling the cover 112 to the opening 111H formed in one surface of the outer periphery of the body part 111, and the cover 112 has the assembly portions 110K which are assembled so as to overlap, from outside, the respective outer peripheral side surfaces 101a adjacent to the opening 111H in the outer circumferential direction S of the case 101. Since the assembly portions 110K are located so as to overlap the outer peripheral side surfaces 101a of the case 101, the assembly portions 110K are to protrude outward on the outer peripheral side surfaces 101a and thus appear as the protrusion 103.

Here, a method for assembling the body part 111 and the cover 112 which form the case 101 will be described.

As shown in FIG. 23, in order to assemble the body part 111 and the cover 112, first, the cover 112 is caused to approach the opening 111H of the body part 111. As the cover 112 approaches the opening 111H, each assembly portion 110K comes into contact with a latch projection 101K formed at the opening 111H side, on the outer peripheral side surface 101a adjacent to the opening 111H of the body part 111. From this contact state, the cover 112 is further pushed, so that the assembly portion 110K is elastically deformed to ride onto the latch projection 101K and then ride over the same. Then, after riding over the latch projection 101K, the assembly portion 110K is latched with the latch projection 101K to establish a detachment prevented state. Thus, the cover 112 is assembled to the opening 111H of the body part 111.

At this time, the cutout portion 23K of the side frame portion 2C of the bracket 1 is located in an overlapping manner above the assembly portion 110K (see lowermost stage in FIG. 23). Thus, the cutout portion 23K functions as a lock portion for preventing the assembled state of the cover 112 with the opening 111H from being released. That is, in order to detach the cover 112 from the opening 111H, it is necessary to move the cover 112 in the direction opposite to the direction in the case of assembly to the opening 111H. However, for this movement, it is necessary to release the latched state of the assembly portion 110K and the latch projection 101K. For the release, the assembly portion 110K needs to be elastically deformed so as to ride onto and ride over the latch projection 101K in the direction opposite to the direction in the case of assembly. However, the side frame portion 2C is located above a distal end portion 111K, of the assembly portion 110K, that is latched with the latch projection 101K. Therefore, the elastic deformation for riding onto and riding over the latch projection 101K cannot be performed. As a result, when the bracket 1 is assembled, a locked state is established in which the latched state of the assembly portion 110K and the latch projection 101K cannot be released.

Here, as shown at the lowermost stage in FIG. 23, the width of the distal end portion 111K of the assembly portion 110K is longer than the thickness of the side frame portion 2C. Therefore, when the bracket 1 is assembled, release of the latched state of the assembly portion 110K and the latch projection 101K can be reliably prevented.

Next, attachment of the bracket 1 to the panel member 200 will be described.

As shown in FIG. 3, the bracket 1 has an insertion latch portion 4 and a go-around latch portion 5. On the other hand, the panel member 200 has a first attachment hole 204 corresponding to the insertion latch portion 4 and a second attachment hole 205 corresponding to the go-around latch portion 5, as through holes that penetrate in the thickness direction.

As shown in FIG. 4, the insertion latch portion 4 extends, from the first side (lower side in FIG. 4) of the main surface opposed portion 3 in the opposition direction 200Y of the latch portions 4, 5, to the rear side (i.e., the side opposite to the side facing the case 101) of the main surface opposed portion 3, and is to be inserted and latched in the corresponding first attachment hole 204 of the panel member 200. Here, the insertion latch portion 4 has a pillar portion 42 and an elastic latch piece 41. The pillar portion 42 extends rearward from the bracket body 10 and is to be inserted into the first attachment hole 204. The elastic latch piece 41 extends from the distal end side toward the base end side of the pillar portion 42, on the first side (lower side in FIG. 4) of the pillar portion 42 in the latch portion opposition direction 200Y, and when the pillar portion 42 is inserted into the first attachment hole 204, the elastic latch piece 41 is latched so as to press the panel member 200 from a back surface 200b side toward a front surface 200a side. In this latched state, the elastic latch piece 41 is elastically deformed toward the second side (upper side in FIG. 4) in the latch portion opposition direction 200Y, and presses, in the first attachment hole 204, the panel member 200 toward the first side (lower side in FIG. 4) in the latch portion opposition direction 200Y.

The elastic latch piece 41 has a base-end-side elastic portion 41B and a distal-end-side elastic portion 41A. The base-end-side elastic portion 41B has an outer surface 41b (hereinafter, referred to as base-end-side slope outer surface 41b) which is on the side opposite to the pillar portion 42 and which has such a slope shape that the distance from the pillar portion 42 increases from the distal end side toward the base end side of the pillar portion 42 (see FIG. 5). The distal-end-side elastic portion 41A has an outer surface 41a (hereinafter, referred to as distal-end-side slope outer surface 41a) which is on the side opposite to the pillar portion 42 and which has such a slope shape that the distance from the pillar portion 42 decreases from the distal end side toward the base end side of the pillar portion 42 (see FIG. 5). Here, the distal-end-side elastic portion 41A and the base-end-side elastic portion 41B form a bent shape bent at the connection portion therebetween, and the base-end-side slope outer surface 41b and the distal-end-side slope outer surface 41a are formed contiguously so as to be folded back.

A distal end portion 41AT (hereinafter, referred to as insertion distal end portion 41AT) of the distal-end-side elastic portion 41A is to pass through the first attachment hole 204 to protrude to the front surface 200a side of the panel member 200 (see FIG. 4). The insertion distal end portion 41AT has an outer surface 41t (see FIG. 25; hereinafter, referred to as distal-end outer surface 41t) which is on the side opposite to the pillar portion 42 and which has such a slope shape as to form a dented corner portion at the connection portion with the distal-end-side slope outer surface 41a, from the distal end side toward the base end side of the pillar portion 42 (see upper stage in FIG. 5).

As shown in FIG. 4, the go-around latch portion 5 has a bent arm shape having a base end portion 53, an intermediate portion 51, and a distal end portion 52, and is formed as an elastic arm that is elastically deformable. The base end portion 53 extends, from the second side (upper side in FIG. 4) opposite to the first side of the main surface opposed portion 3 in the latch portion opposition direction 200Y, to the rear side (i.e., the side opposite to the side facing the case 101) of the main surface opposed portion 3, and is to be inserted into the corresponding second attachment hole 205 of the panel member 200. The intermediate portion 51 goes around to the back surface 200b side of the panel member 200 from the base end portion 53 located in the second attachment hole 205, and extends along the back surface 200b toward the second side (upper side in FIG. 4) in the latch portion opposition direction 200Y. The distal end portion 52 is a contact portion which comes into contact with the panel member 200 from the back surface 200*b* side, on the distal end side of the intermediate portion 51 which comes around to the back surface 200*b* side. Here, the distal end portion 52 is a projection that projects from the distal end of the intermediate portion 51 toward the panel member 200 side, to come into contact with the back surface 200*b* thereof. In the contact state of the distal end portion 52, the go-around latch portion 5 is elastically deformed in such a direction that the distal end portion 52 side is separated from the back surface 200*b* of the panel member 200, and as a result, the distal end portion 52 has contact with the back surface 200*b* of the panel member 200 so as to press the back surface 200*b* toward the front surface 200*a* side.

Here, the attachment method and the attachment structure 2000 for attaching the bracket 1 to the panel member 200 will be specifically described with reference to FIG. 5.

First, as shown at the upper stage in FIG. 5, the go-around latch portion 5 of the bracket 1 is inserted through the second attachment hole 205 of the panel member 200. When the go-around latch portion 5 is inserted through the second attachment hole 205, the base end portion 53 passes through the second attachment hole 205 of the panel member 200 and the intermediate portion 51 extends toward the second side (right side in FIG. 5) in the latch portion opposition direction 200Y, on the back surface 200*b* side of the panel member 200.

From this state, the insertion latch portion 4 of the bracket 1 is inserted into the first attachment hole 204 of the panel member 200. At this time, as shown at the middle stage in FIG. 5, the insertion latch portion 4 is elastically deformed to be contracted as a whole by the elastic latch piece 41 approaching the pillar portion 42, and thereby is inserted through the first attachment hole 204. Specifically, as the insertion latch portion 4 is inserted into the first attachment hole 204, the base-end-side slope outer surface 41*b* presses while sliding on an inner edge 204*c* (see FIG. 6B), of the first attachment hole 204, that is on the first side (left side at the middle stage in FIG. 5: arrow p0 direction side) in the latch portion opposition direction 200Y. By this pressing, the elastic latch piece 41 is elastically deformed so as to approach the pillar portion 42 as the insertion advances. In addition, by this pressing, the entire bracket 1 is pressed toward the second side (right side at the middle stage in FIG. 5: arrow P0 direction side) in the latch portion opposition direction 200Y, and the base end portion 53 of the go-around latch portion 5 is in contact with and pressed to an inner edge 205*d* on the second side of the second attachment hole 205, whereby an inserted pressed state is established.

Then, as the insertion of the insertion latch portion 4 into the first attachment hole 204 is advanced, as shown at the middle stage in FIG. 5, the distal end portion 52 of the go-around latch portion 5 of the bracket 1 comes into contact with the back surface 200*b* of the panel member 200, and a fulcrum portion 7 of the bracket 1 comes into contact with the front surface 200*a* of the panel member 200. From here, in order to further insert the insertion latch portion 4, the insertion latch portion 4 needs to be further elastically deformed to be closer to the pillar portion 42. At this time, the principle of leverage is exerted in which the insertion latch portion 4 being pressed into the first attachment hole 204 is the point of effort, the fulcrum portion 7 in contact with the front surface 200*a* of the panel member 200 is the fulcrum, and the distal end portion 52, of the go-around latch portion 5, that is in contact with the back surface 200*b* of the panel member 200 is the point of load. Therefore, even if the force for pressing the insertion latch portion 4 into the first attachment hole 204 is comparatively small, a great insertion force can be produced owing to the principle of leverage. Thus, it is possible to easily insert the insertion latch portion 4 into the first attachment hole 204.

The fulcrum portion 7 is provided at a position on the go-around latch portion 5 side, between the insertion latch portion 4 and the go-around latch portion 5, on the main surface opposed portion 3, and here, comes into contact with the panel member 200 from the front surface 200*a* side. The fulcrum portion 7 shown in FIG. 5 is located above the second attachment hole 205 and thus appears to be not in contact with the front surface 200*a* of the panel member 200, but actually, as shown in FIG. 4, the fulcrum portion 7 is in contact with the peripheral part around the second attachment hole 205 on the panel member 200 from the front surface 200*a* side. In addition, here, as shown in FIG. 1, the fulcrum portion 7 is formed as a long rib extending toward both sides in the width direction of the go-around latch portion 5, on the base end side of the base end portion 53 of the go-around latch portion 5.

As the insertion of the insertion latch portion 4 into the first attachment hole 204 is further advanced using the principle of leverage, the base-end-side elastic portion 41B of the insertion latch portion 4 finishes passing through the first attachment hole 204. Then, in turn, the distal-end-side elastic portion 41A of the insertion latch portion 4 passes through the first attachment hole 204. When the distal-end-side elastic portion 41A passes through the first attachment hole 204, as shown at the lower stage in FIG. 5, the distal-end-side slope outer surface 41*a* presses while sliding on the inner edge 204*c* (see FIG. 6B), of the first attachment hole 204, that is on the first side in the latch portion opposition direction 200Y. The distal-end-side slope outer surface 41*a*, owing to its slope shape, presses the inner edge 204*c* of the first attachment hole 204 that is on the first side in the latch portion opposition direction 200Y, toward the first side (left side at lower stage in FIG. 5: arrow p1 direction side), and also presses the panel member 200 from the back surface 200*b* side toward the front surface 200*a* side. As a result, while the elastic latch piece 41 is gradually elastically restored, the insertion latch portion 4 further moves deeply through the first attachment hole 204 by its own force of the distal-end-side slope outer surface 41*a* pressing the inner edge 204*c* of the first attachment hole 204 that is on the first side in the latch portion opposition direction 200Y. This movement stops at a position where the panel member 200 comes into contact with an abutting wall portion 8 formed on the main surface opposed portion 3 of the bracket 1, as shown at the lower stage in FIG. 5.

In the stopped state, since the elastic latch piece 41 has not been completely elastically restored yet, the state is still kept in which the distal-end-side slope outer surface 41*a* presses the inner edge 204*c* of the first attachment hole 204 that is on the first side in the latch portion opposition direction 200Y, toward the first side (left side at lower stage in FIG. 5: arrow p1 direction side), and also presses the panel member 200 from the back surface 200*b* side toward the front surface 200*a* side. That is, the insertion latch portion 4 in this state is in an inserted latched state in which the distal-end-side slope outer surface 41*a* of the elastic latch piece 41 is latched (contacts) from the back surface 200*b* side of the panel member 200. At this time, the go-around latch portion 5 is also in a latched state by going around to the back surface 200*b* side of the panel member 200. Such a state in which latching between both the insertion latch portion 4 and the go-around latch portion 5 is established is the attached state in which the bracket 1 is attached to the panel member 200.

In the attached state, as described above, on the first side (left side at lower stage in FIG. 5) in the latch portion opposition direction 200Y of the panel member 200, the elastic latch piece 41 that has not been completely elastically restored yet is kept constantly pressing elastically toward the abutting wall portion 8 side (i.e., main surface opposed portion 3 side). Thus, on the first side of the attached panel member 200, the bracket 1 is in a state in which rattling in the approaching/separation direction with respect to the panel member 200 is suppressed.

In the attached state, on the second side (right side at lower stage in FIG. 5) in the latch portion opposition direction 200Y of the panel member 200, the go-around latch portion 5 is in an elastically deformed state in which the go-around latch portion 5 goes around to the back surface 200b side and is elastically deformed in such a direction that the distal end portion 52 side is separated from the panel member 200, and the distal end portion 52 is kept constantly pressing elastically the panel member 200 toward the fulcrum portion 7 side (i.e., main surface opposed portion 3 side). Thus, on the second side in the latch portion opposition direction 200Y of the attached panel member 200, the bracket 1 is in a state in which rattling in the approaching/separation direction with respect to the panel member 200 is suppressed.

In addition, in the attached state, on the first side in the latch portion opposition direction 200Y of the panel member 200, the elastic latch piece 41 that has not been completely elastically restored yet is kept constantly pressing elastically the inner edge 204c of the first attachment hole 204 toward the first side (p1 direction side at lower stage in FIG. 5). In addition, by this pressing, the bracket 1 as a whole is kept being constantly pressed also toward the second side (p2 direction side at lower stage in FIG. 5) in the latch portion opposition direction 200Y. Therefore, the bracket 1 is in a state in which rattling toward the first side and the second side in the latch portion opposition direction 200Y relative to the attached panel member 200 is suppressed.

In addition, in the attached state, the latch portions 4, 5 not only come into latched states by being inserted into the respective attachment holes 204, 205 and having contact with the inner edges 204c, 205d thereof, but also the positions of the latch portions 4, 5 are retained at predetermined positions in the attachment holes 204, 205. Hereinafter, this position retention will be described.

Figure 6A:
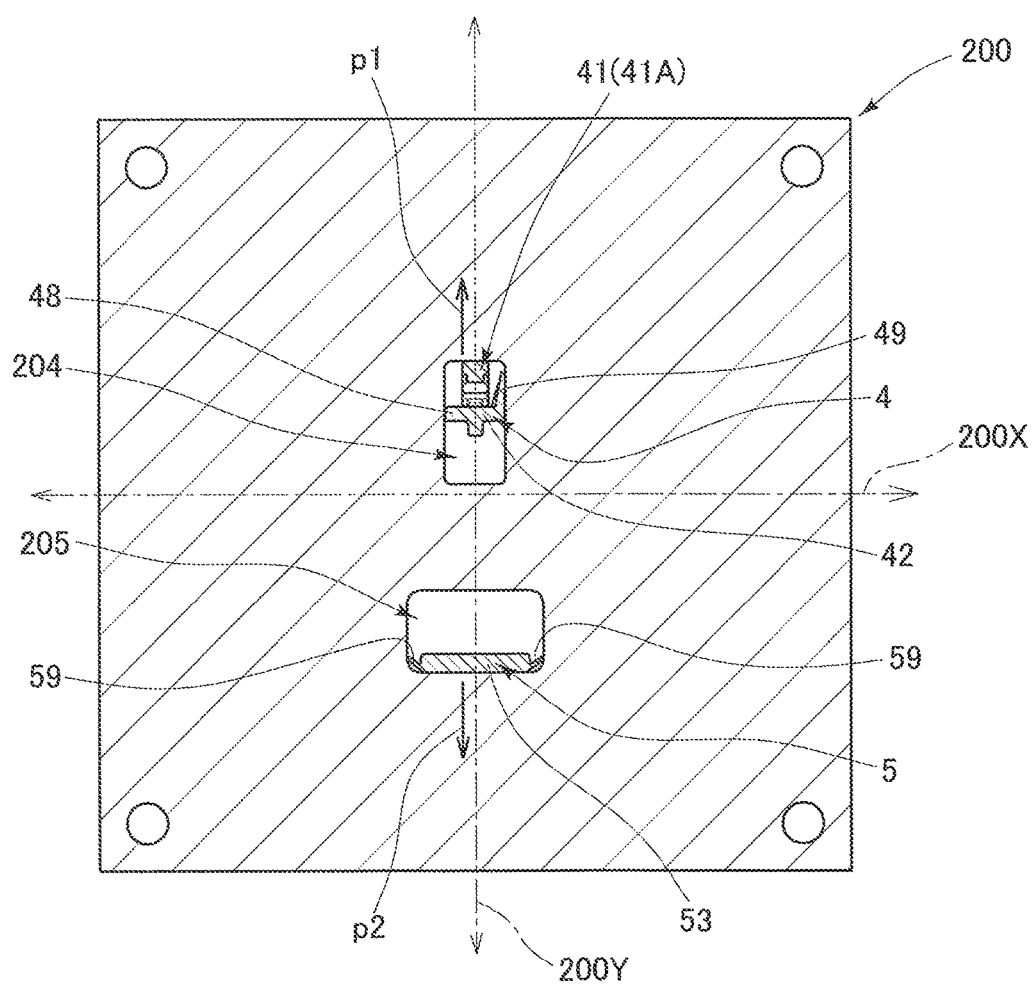
FIG. 6A is a sectional view showing a state in which latch portions are inserted into attachment holes, when the panel member is cut along a plane parallel with the main surface thereof.
Figure 6B:
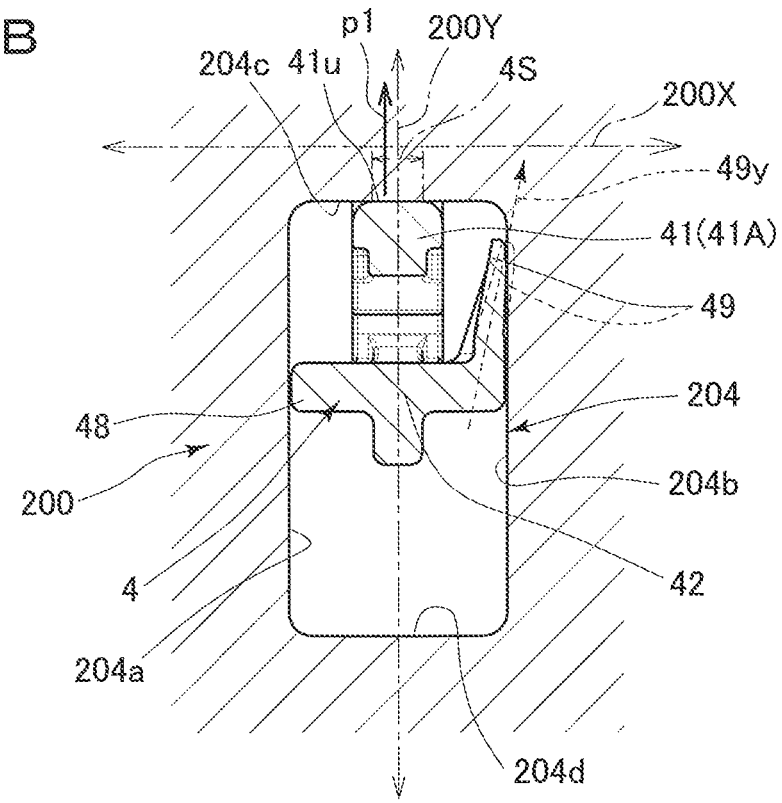
FIG. 6B is an enlarged sectional view of a part around an insertion latch portion in FIG. 6A.

As shown in FIG. 6A, the insertion latch portion 4 and the inner edge of the first attachment hole 204 have position retaining portions by which, in the inserted latched state, the elastic latch piece 41 (distal-end-side elastic portion 41A) constantly pressed toward the first side (upper side in FIG. 6A) in the latch portion opposition direction 200Y is retained at a first predetermined position set in contact with the inner edge 204c (see FIG. 6B) of the first attachment hole 204 on the first side in the latch portion opposition direction 200Y. Here, as shown in FIG. 6B, attachment hole inner edge pressing portions 48, 49 provided to the pillar portion 42, and inner edges 204a, 204b of the first attachment hole 204, function as the position retaining portions.

Here, the elastic latch piece 41 suppresses, by its own pressing, rattling in the latch portion opposition direction 200Y (up-down direction in FIG. 6A), in the first attachment hole 204. However, if the elastic latch piece 41 does not have means for preventing rattling in a perpendicular direction 200X (right-left direction in FIG. 6A) perpendicular to the latch portion opposition direction 200Y, it is impossible to retain the insertion latch portion 4 at the first predetermined position by only the elastic latch piece 41.

In this regard, the attachment hole inner edge pressing portion 48 is a contact portion to have contact with the inner edge 204a of the first attachment hole 204, on the first side (left side in FIG. 6B) in the perpendicular direction 200X, in a state in which the insertion latch portion 4 is inserted and latched in the first attachment hole 204. On the other hand, the attachment hole inner edge pressing portion 49 is an elastic piece that is elastically deformable so as to press the inner edge 204b of the first attachment hole 204, on the opposite second side (right side in FIG. 6B), in a state in which the insertion latch portion 4 is inserted and latched in the first attachment hole 204. Thus, in a state in which the insertion latch portion 4 is inserted and latched in the first attachment hole 204, the attachment hole inner edge pressing portions 48, 49 constantly press the inner edges 204a, 204b of the first attachment hole 204 in the perpendicular direction 200X, whereby rattling in the perpendicular direction 200X (right-left direction in FIG. 6B) is prevented and the insertion latch portion 4 can be retained at the first predetermined position.

Specifically, the first attachment hole 204 is formed as a quadrangular through hole, more specifically, as a rectangular through hole longer in the latch portion opposition direction 200Y than the second attachment hole 205, and is enclosed by four straight inner edges 204a, 204b, 204c, 204d each perpendicular to the latch portion opposition direction 200Y or the perpendicular direction 200X. The attachment hole inner edge pressing portion 48 is an end on the first side (left side in FIG. 6B) in the perpendicular direction 200X, of the pillar portion 42 having a predetermined width in the perpendicular direction 200X. The end surface of the attachment hole inner edge pressing portion 48 has a contact area to come into surface-to-surface contact straightly with the straight inner edge 204a of the first attachment hole 204 that is on the first side in the perpendicular direction 200X. On the other hand, the attachment hole inner edge pressing portion 49 is an elastic piece which extends from an end on the second side (right side in FIG. 6B) of the pillar portion 42 having the predetermined width in the perpendicular direction 200X, and which is elastically deformable toward the first side in the perpendicular direction 200X. Therefore, in a state in which the insertion latch portion 4 is inserted and latched in the first attachment hole 204, the attachment hole inner edge pressing portion 49 is stored in the first attachment hole 204 while being elastically deformed toward the first side in the perpendicular direction 200X, and thus constantly presses the straight inner edge 204b of the first attachment hole 204.

Here, the attachment hole inner edge pressing portion 49 is formed so as to extend in an oblique direction 49y (see FIG. 6B) which is toward the latch portion opposition direction 200Y side (here, upper side in FIG. 6B) and the second side (right side in FIG. 6B) in the perpendicular direction 200X. In the inserted latched state (lower stage in FIG. 5) of the insertion latch portion 4, the attachment hole inner edge pressing portion 49 is kept in an elastically deformed state so as to be pushed and elastically bent toward the first side in the perpendicular direction 200X, and thus constantly presses the inner edge 204b of the first attachment hole 204. Thus, the insertion latch portion 4 constantly presses the inner edges 204a, 204b of the first attachment hole 204 in the perpendicular direction 200X, thereby achieving rattling prevention and position retention in the perpendicular direction 200X.

Figure 6C:
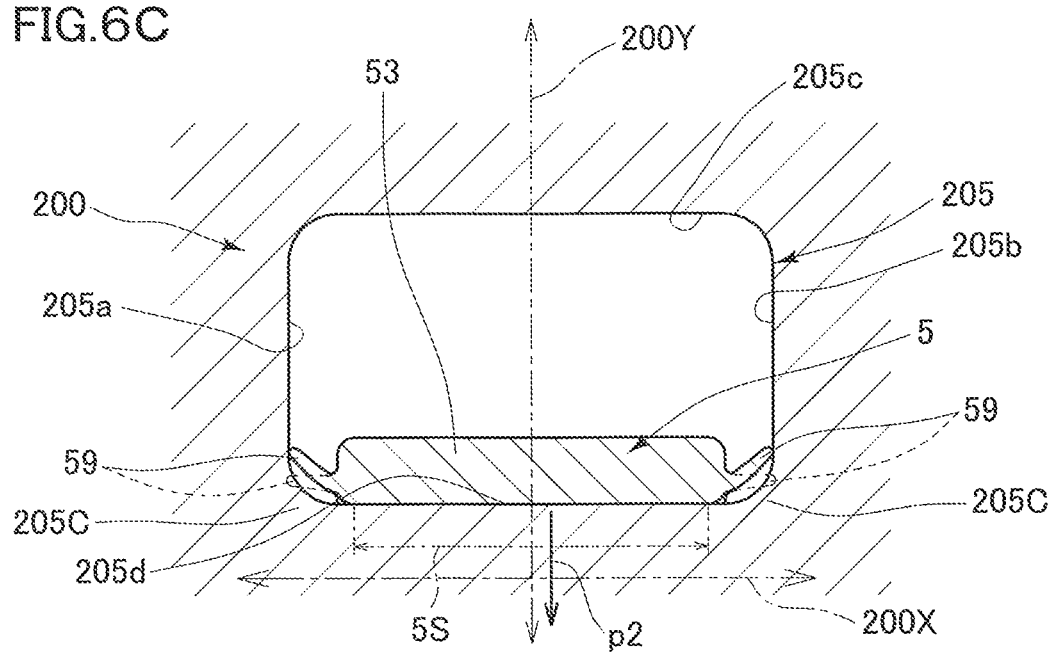
FIG. 6C is an enlarged sectional view of a part around a go-around latch portion in FIG. 6A.

On the other hand, as shown in FIG. 6A, the go-around latch portion 5 and the inner edge of the second attachment hole 205 also have position retaining portions by which, in the go-around latched state, the base end portion 53 constantly pressed toward the second side (lower side in FIG. 6A) in the latch portion opposition direction 200Y is retained at a second predetermined position set on the inner edge 205*d* on the second side of the second attachment hole 205. Here, as shown in FIG. 6C, attachment hole inner edge pressing portions 59, 59 provided to the base end portion of the go-around latch portion 5, and inner edges 205*a*, 205*b* of the second attachment hole 205, function as the position retaining portions.

Here, the base end portion 53 is pressed toward the inner edge 205*d* of the second attachment hole 205 that is on the second side in the latch portion opposition direction 200Y, by the elastic latch piece 41 being pressed toward the first side in the latch portion opposition direction 200Y in the first attachment hole 204 on the opposite side, whereby rattling in the latch portion opposition direction 200Y (up-down direction in FIG. 6A) is suppressed. However, if the base end portion 53 does not have means for preventing rattling in the perpendicular direction 200X (right-left direction in FIG. 6A) perpendicular to the latch portion opposition direction 200Y, it is impossible to retain the go-around latch portion 5 at the second predetermined position by only the base end portion 53.

In this regard, the go-around latch portion 5 has such a shape that the attachment hole inner edge pressing portions 59, 59 are provided to the base end portion 53, in order to prevent rattling in the perpendicular direction 200X and stay at the second predetermined position. The attachment hole inner edge pressing portions 59, 59 are elastic pieces that are elastically deformable so as to press the inner edges 205*a*, 205*b* of the second attachment hole 205, on the first side and the opposite second side (left side and right side in FIG. 6C) in the perpendicular direction 200X, in the go-around latched state in which the go-around latch portion 5 is latched with the second attachment hole 205. Thus, in a state in which the go-around latch portion 5 is inserted and latched in the second attachment hole 205, the go-around latch portion 5 constantly presses the inner edges 205*a*, 205*b* of the second attachment hole 205, whereby rattling in the perpendicular direction 200X (right-left direction in FIG. 6C) is prevented and the go-around latch portion 5 can be retained at the second predetermined position.

Specifically, the second attachment hole 205 is formed as a quadrangular through hole, more specifically, as a rectangular through hole longer in the perpendicular direction 200X than the first attachment hole 204, and is enclosed by four straight inner edges 205*a*, 205*b*, 205*c*, 205*d* each perpendicular to the latch portion opposition direction 200Y or the perpendicular direction 200X. The attachment hole inner edge pressing portions 59, 59 are elastic pieces which extend outward from ends on both sides (both right and left sides in FIG. 6C) of the base end portion 53 having a predetermined width in the perpendicular direction 200X, and which are elastically deformable inward in the perpendicular direction 200X by being pressed from the distal end side (i.e., intermediate portion 51 side) of the base end portion 53. Thus, in a go-around latched state in which the go-around latch portion 5 is latched with the second attachment hole 205, the attachment hole inner edge pressing portions 59, 59 are stored in the second attachment hole 205 while being elastically deformed inward in the perpendicular direction 200X, and thus constantly press the straight inner edges 205*a*, 205*b* of the second attachment hole 205.

Here, the attachment hole inner edge pressing portions 59, 59 are formed so as to extend from the base end portion 53 outward in the perpendicular direction 200X. In the go-around latched state (see lower stage in FIG. 5) of the go-around latch portion 5, the attachment hole inner edge pressing portions 59, 59 are kept in an elastically deformed state so as to be pushed and elastically bent inward in the perpendicular direction 200X, and thus constantly press the inner edges 205*a*, 205*b* of the second attachment hole 205. Thus, the go-around latch portion 5 constantly presses the inner edges 205*a*, 205*b* of the second attachment hole 205 in the perpendicular direction 200X, thereby achieving rattling prevention and position retention in the perpendicular direction 200X.

It is noted that the attachment hole inner edge pressing portions 49, 59, 59 are spaced from the main surface opposed portion 3 and thus are formed without being connected to the main surface opposed portion 3. Thus, the attachment hole inner edge pressing portions 49, 59, 59 can be easily elastically deformed.

Here, regarding the insertion latch portion 4 and the go-around latch portion 5, the go-around latch portion 5 (base end portion 53) has a broader width in the perpendicular direction 200X than the insertion latch portion 4 (elastic latch piece 41, pillar portion 42). Also, regarding the first attachment hole 204 and the second attachment hole 205, the second attachment hole 205 has a broader hole width in the perpendicular direction 200X than the first attachment hole 204. Therefore, in this embodiment, a second side pressing area 5S in which, on the second side (lower side in FIG. 6A and FIG. 6C) in the latch portion opposition direction 200Y, the go-around latch portion 5 presses the second attachment hole 205 toward the second side is set as an area that is longer in the direction 200X perpendicular to the pressing direction (i.e., latch portion opposition direction 200Y) than a first side pressing area 4S in which, on the first side (upper side in FIG. 6A and FIG. 6B) in the latch portion opposition direction 200Y, the insertion latch portion 4 presses the first attachment hole 204 toward the first side. That is, since the go-around latch portion 5 is longer in the perpendicular direction 200X, the go-around latch portion 5 can be regarded as being in contact with, at two locations on both end sides in the perpendicular direction 200X, the inner edge 205*d* of the second attachment hole 205 that is on the second side in the latch portion opposition direction 200Y, whereas, since the insertion latch portion 4 is shorter in the perpendicular direction 200X, the insertion latch portion 4 can be regarded as being in contact with, at one location, the inner edge 204*c* of the first attachment hole 204 that is on the first side in the latch portion opposition direction 200Y. Thus, it can be said that the bracket 1 is attached while pressing three different points of the panel member 200 toward sides separated from each other. Such three-point support not only prevents rattling in the latch portion opposition direction 200Y but also prevents rattling in a direction of rotation about one of the three points on a plane passing through the three points. In addition, there is an advantage that, as in a tripod or the like, the three-point support is stable as compared to two-point or one-point support and is efficient as compared to four-or-more-point support.

By the bracket 1 being attached to the panel member 200 in the above-described manner, even if the bracket 1 is subjected to a force in the perpendicular direction 200X due to travelling vibration of a vehicle or the like, the insertion latch portion 4 and the go-around latch portion 5 can be retained at the first predetermined position and the second predetermined position set in the first attachment hole 204 and the second attachment hole 205 by using a constantly pressing force in the latch portion opposition direction 200Y via the elastic latch piece 41 and constantly pressing forces in the perpendicular direction 200X via the attachment hole inner edge pressing portions 49, 59, 59. Even if displacement from these predetermined positions occurs, the insertion latch portion 4 and the go-around latch portion 5 are pushed back by the pressing forces acting in the latch portion opposition direction 200Y and the perpendicular direction 200X, so that they can easily return to the original predetermined positions.

Next, a method for detaching the bracket 1 from the panel member 200 and the attachment structure 2000 enabling the same will be specifically described with reference to FIG. 24 and FIG. 25.

In order to detach the bracket 1 from the panel member 200, a jig 9D is inserted into the space 9S between the bracket 1 and the panel member 200, and the elastic latch piece 41 (insertion distal end portion 41A) is pushed toward the pillar portion 42 side by the jig 9D, to release the inserted latched state with respect to the first attachment hole 204, thereby enabling the detachment.

Here, in order to facilitate pushing to the elastic latch piece 41 (insertion distal end portion 41A) by the jig 9D, a cutout portion 39 is provided in the main surface opposed portion 3 of the bracket 1 (see FIG. 3). Specifically, the cutout portion 39 has a shape obtained by cutting the main surface opposed portion 3 of the bracket 1 from the end on the first side in the latch portion opposition direction 200Y to the part directly under the elastic latch piece 41 of the insertion latch portion 4. In a state in which the bracket 1 is attached to the panel member 200, by inserting a jig 9D (here, stick-shaped jig) from the open side on the first side of the cutout portion 39, the distal end portion 41AT (hereinafter, referred to as insertion distal end portion 41AT) of the elastic latch piece 41 that protrudes to the bracket 1 side through the first attachment hole 204 can be elastically deformed toward the pillar portion 42 side, and by the elastic deformation, the inserted latched state of the insertion latch portion 4 with respect to the first attachment hole 204 is released, whereby the bracket 1 can be detached from the panel member 200.

Figure 24:
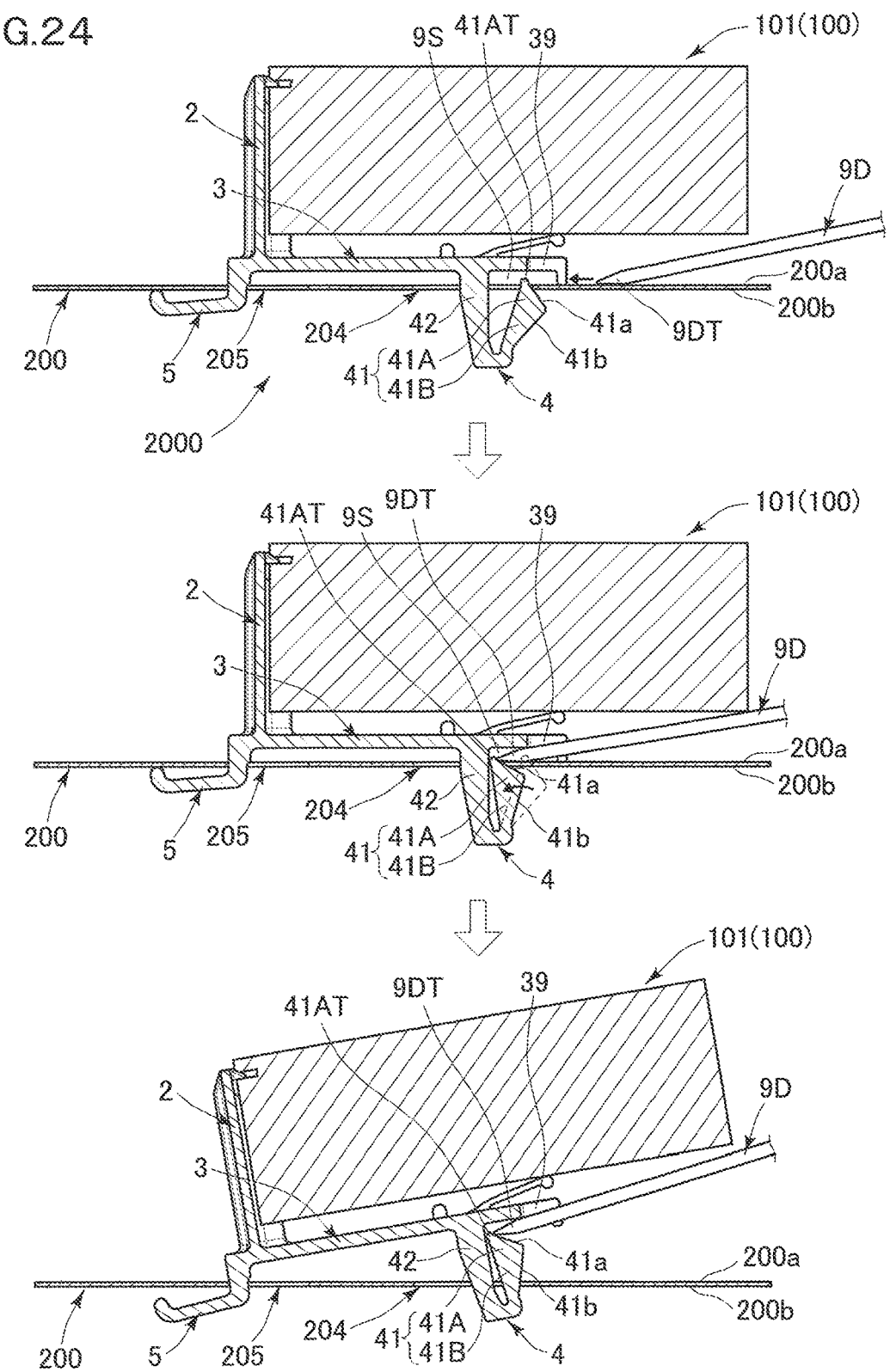
FIG. 24 is a method for detaching the bracket from the panel member, using a cross section along XXIV-XXIV line in FIG. 20.

Specifically, first, as shown at the upper stage in FIG. 24, a stick-shaped jig 9D like a flat-blade screwdriver is inserted into the deeper side from the open side of the cutout portion 39 along the front surface 200a of the panel member 200 (for example, so as to slide on the front surface 200a). Then, the jig 9D comes into contact with the insertion distal end portion 41A of the elastic latch piece 41. However, in spite of the contact, the insertion of the stick-shaped jig 9D cannot be stopped, and the insertion of the stick-shaped jig 9D continues while elastically deforming the elastic latch piece 41 toward the pillar portion 42 side. This insertion continues until the elastically deformed elastic latch piece 41 (insertion distal end portion 41A) comes into contact with the pillar portion 42, as shown at the middle stage in FIG. 24.

When the elastic latch piece 41 (insertion distal end portion 41A) comes into contact with the pillar portion 42, the inserted latched state with respect to the first attachment hole 204 is released, so that the entire insertion latch portion 4 including the elastic latch piece 41 is allowed to come off the first attachment hole 204. Therefore, in the state as shown at the middle stage in FIG. 24, the base end side of the stick-shaped jig 9D is raised in such a direction as to be separated from the panel member 200 with the distal end side of the stick-shaped jig 9D kept as it is, whereby the bracket 1 or the case 101 is pushed up and the insertion latch portion 4 comes off the first attachment hole 204. After the insertion latch portion 4 comes off, the bracket 1 can be detached from the panel member 200 just by detaching the go-around latch portion 5 from the second attachment hole 205.

Here, the stick-shaped jig 9D is a flat-blade screwdriver and a tip end portion 9DT thereof has a tapered shape. Therefore, a procedure for detaching the bracket 1 from the panel member 200 from the state shown at the middle stage in FIG. 24 is as follows.

Figure 25:
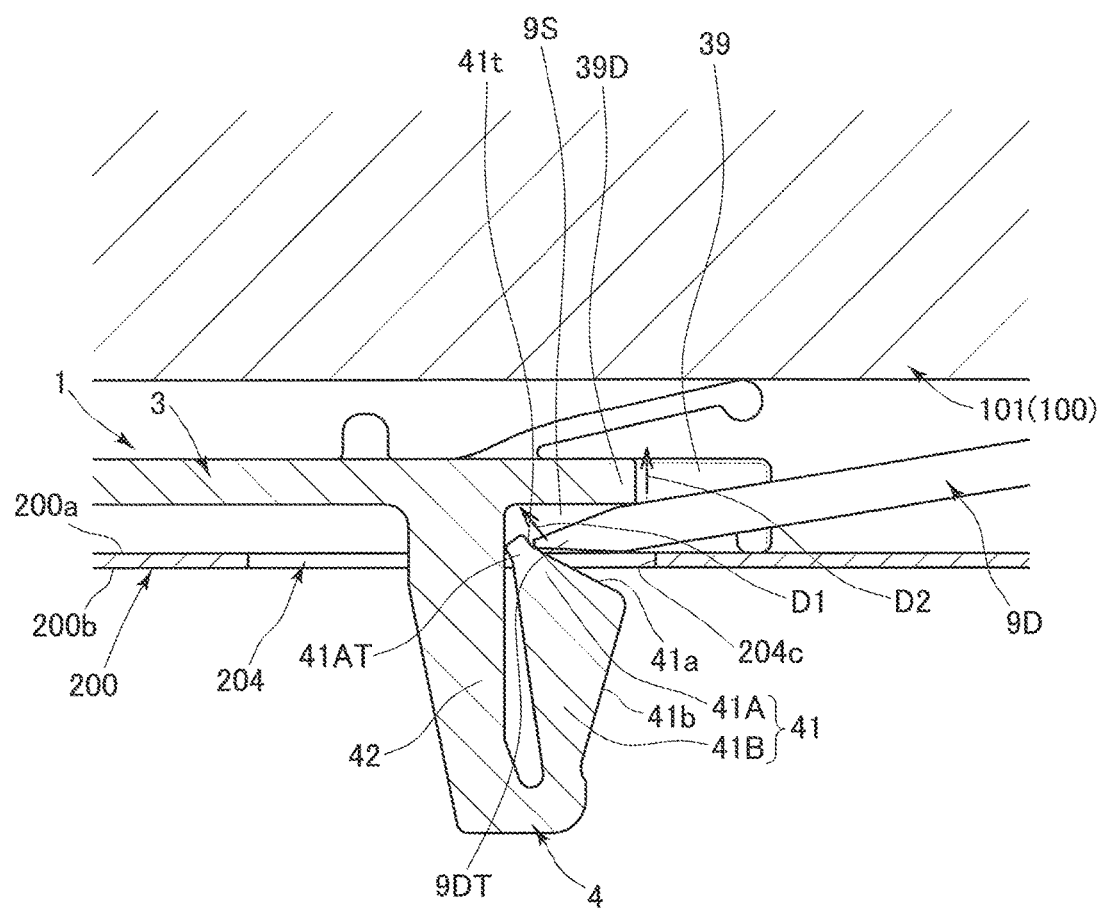
FIG. 25 is an enlarged sectional view of a part of the cross section in FIG. 24, for illustrating coming-off of the bracket from the panel member in detail.
Figure 26:
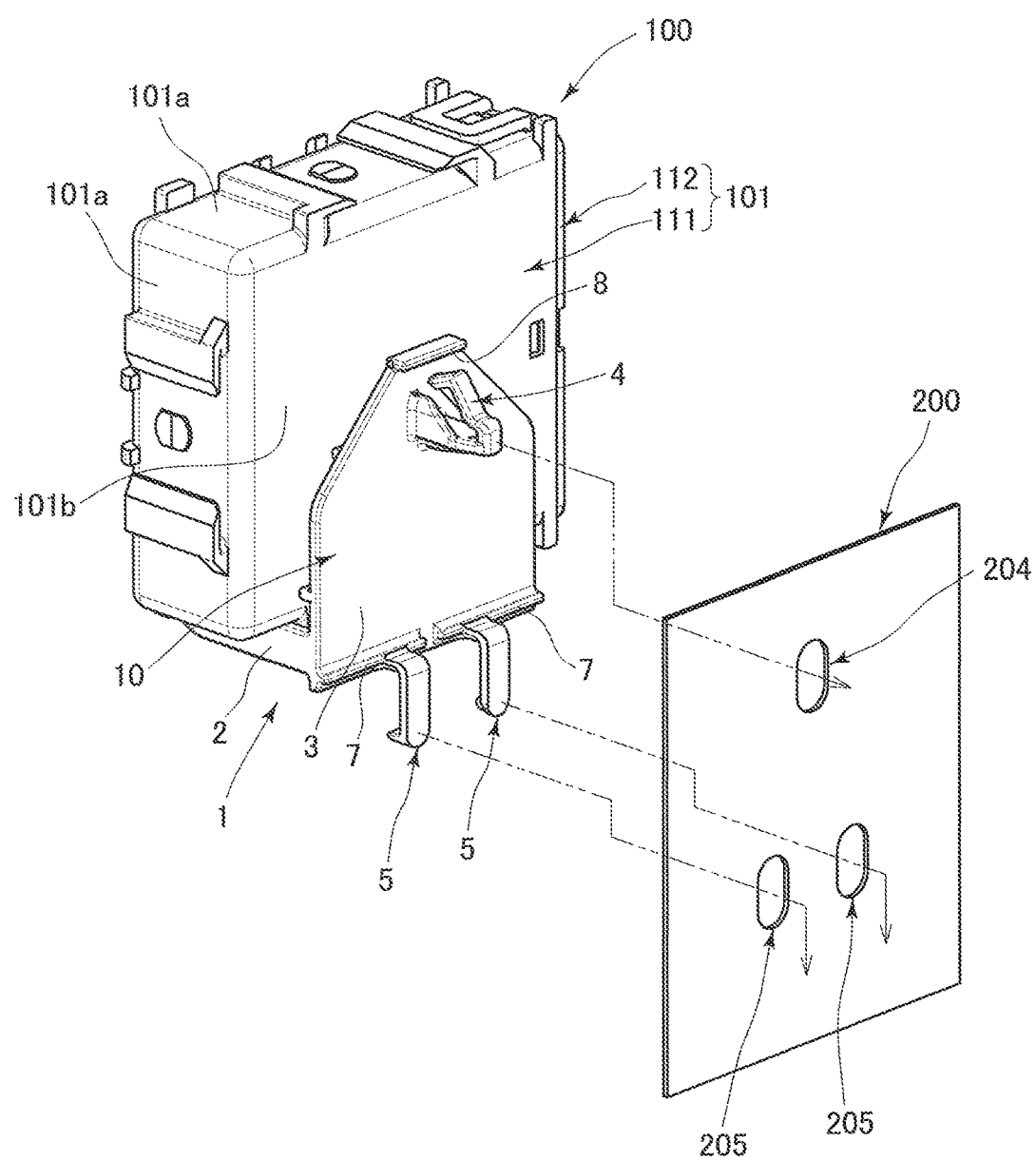
FIG. 26 is an exploded perspective view showing a bracket and a panel member separated from each other in an attachment structure for the bracket and the panel member according to the second embodiment of this invention.

That is, as shown in FIG. 25, the stick-shaped jig 9D that has brought the elastic latch piece 41 (insertion distal end portion 41A) into contact with the pillar portion 42 is further inserted to a deeper side in the insertion direction. Specifically, the stick-shaped jig 9D having contact with the insertion distal end portion 41A of the elastic latch piece 41 is further inserted to a deeper side in the insertion direction while sliding on the distal-end outer surface 41t of the insertion distal end portion 41A. At this time, since the distal-end outer surface 41t of the insertion distal end portion 41A is formed as a slope surface ascending toward the bracket 1 side in the insertion direction of the stick-shaped jig 9D, the stick-shaped jig 9D moves in an arrow D1 direction while sliding on the distal-end outer surface 41t of the insertion distal end portion 41A. By this movement, the stick-shaped jig 9D is displaced toward the bracket 1 side, and as a result, comes into contact with a bottom portion 39D of the cutout portion 39 of the bracket 1 and pushes up the bottom portion 39D in an arrow D2 direction. That is, once the stick-shaped jig 9D has been inserted into the cutout portion 39 of the bracket 1 along the front surface 200a of the panel member 200, simply by directly inserting the stick-shaped jig 9D to a deeper side, the stick-shaped jig 9D not only releases the latched state of the insertion latch portion 4 but also is naturally displaced in such a direction as to approach the bracket 1, thereby lifting up the bracket 1 in such a direction as to cause the bracket 1 to come off the panel member 200. Therefore, while the bracket 1 is being lifted up, if the tip end side of the stick-shaped jig 9D is directly moved in an arrow D2 direction so as to be scooped up, the bracket 1 can be easily detached from the panel member 200. It is noted that the internal structure of the case 101 is not shown in FIG. 24 and FIG. 25.

Although the first embodiment of this invention has been described above, this embodiment is merely illustrative, this invention is not limited thereto, and various modifications such as additions and omissions may be made on the basis of the knowledge of a person skilled in the art without departing from the scope of the claims.

Hereinafter, other embodiments different from the above embodiment, and modifications, will be described. It is noted that parts having the same functions as those in the above embodiment are denoted by the same reference characters, and the detailed description thereof is omitted. The above embodiment and the following examples may be combined to be implemented as appropriate as long as no technical contradiction arises.

The bracket 1 of the above embodiment is attached to the panel member 200 by using one insertion latch portion 4 and one go-around latch portion 5 having a broader width than the insertion latch portion 4. However, the numbers of insertion latch portions 4 and go-around latch portions 5 may be different from the above numbers.

For example, attachment to the panel member 200 may be made by one insertion latch portion 4 and two go-around latch portions 5. Hereinafter, the second embodiment shown in FIG. 26 and FIGS. 27A to 27C will be described.

Figure 27A:
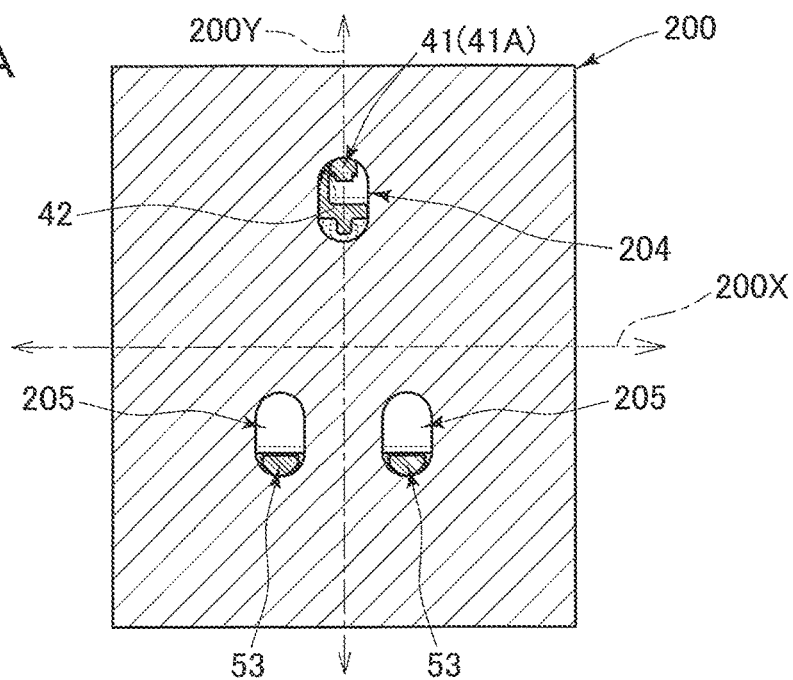
FIG. 27A is a sectional view showing a state in which latch portions are inserted into attachment holes, when the panel member in FIG. 26 is cut along a plane parallel with the main surface thereof.
Figure 27B:
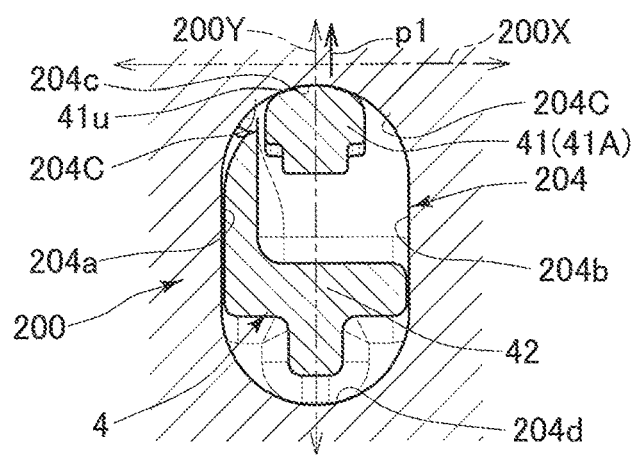
FIG. 27B is an enlarged sectional view of a part around an insertion latch portion in FIG. 27A.

In the second embodiment, the panel member 200 has one first attachment hole 204, and one insertion latch portion 4 is inserted and latched in the first attachment hole 204. As shown in FIG. 27B, the inner edge 204c of the first attachment hole 204 that is on the first side in the latch portion opposition direction 200Y has a position retaining shape for retaining, at a first predetermined position on the inner edge 204c, the elastic latch piece 41 (distal-end-side elastic portion 41A) pressed toward the first side. Here, when the elastic latch piece 41 is pressed toward the first side in the latch portion opposition direction 200Y, the inner edge 204c has opposed portions 204C, 204C opposed on both sides in the perpendicular direction 200X perpendicular to the pressing direction p1 of the bracket 1 by the elastic latch piece 41, and the opposition width thereof narrows toward the first side. A position where the elastic latch piece 41 is sandwiched from both sides between the opposed portions 204C, 204C is defined as the first predetermined position of the insertion latch portion 4.

Specifically, here, the inner edge 204c of the first attachment hole 204 is formed in an arc shape, and a contact surface 41u (surface of the elastic latch piece 41 that is on the first side (upper side in FIG. 27B) in the latch portion opposition direction 200Y), of the elastic latch piece 41, that comes into contact with the inner edge 204c of the first attachment hole 204, is formed in an arc shape having a smaller diameter than that of the arc of the inner edge 204c. In this case, the position on the arc-shaped inner edge 204c that is closest to the first side in the latch portion opposition direction 200Y is the first predetermined position, an arc section thereof on the first side in the perpendicular direction 200X with respect to the first predetermined position is one opposed portion 204C, and an arc section thereof on the opposite second side is the other opposed portion 204C. When the elastic latch piece 41 is at the first predetermined position, the elastic latch piece 41 is in contact with both opposed portions 204C, 204C, and the both-contact state corresponds to the state of being sandwiched from both sides between the opposed portions 204C, 204C as described above.

Figure 27C:
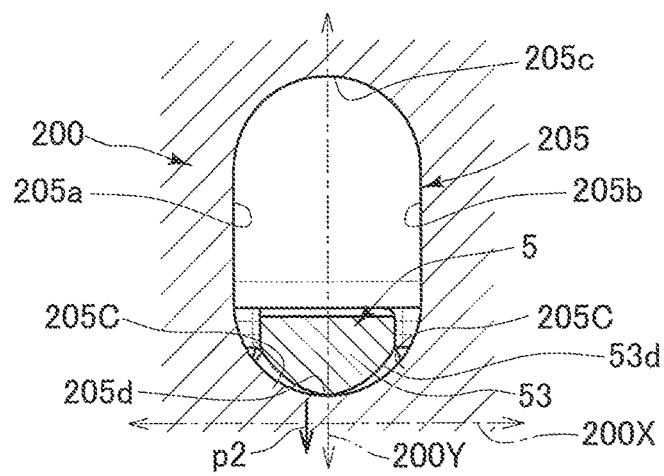
FIG. 27C is an enlarged sectional view of a part around a go-around latch portion in FIG. 27A.

In the second embodiment, two second attachment holes 205 are provided to the panel member 200, and one go-around latch portion 5 is inserted and latched to each of the second attachment holes 205, 205. As shown in FIG. 27C, the inner edge 205d of each second attachment hole 205 that is on the second side in the latch portion opposition direction 200Y has a position retaining shape for retaining, at a second predetermined position on the inner edge 205d, the base end portion 53 of the go-around latch portion 5 that is pressed toward the second side. Here, when the base end portion 53 of the go-around latch portion 5 is pressed toward the second side in the latch portion opposition direction 200Y, the inner edge 205d has opposed portions 205C, 205C opposed on both sides in the perpendicular direction 200X perpendicular to the pressing direction p2 of the bracket 1 by the base end portion 53, and the opposition width thereof narrows toward the second side in the latch portion opposition direction 200Y. A position where the base end portion 53 is sandwiched from both sides between the opposed portions 205C, 205C is defined as the second predetermined position.

Specifically, here, the inner edge 205d of the second attachment hole 205 is formed in an arc shape, and a contact surface 53d (surface of the base end portion 53 that is on the second side (lower side in FIG. 27C) in the latch portion opposition direction 200Y), of the base end portion 53 of the go-around latch portion 5, that comes into contact with the inner edge 205d of the second attachment hole 205, is formed in an arc shape having a smaller diameter than that of the arc of the inner edge 205d. In this case, the position on the arc-shaped inner edge 205d that is closest to the second side in the latch portion opposition direction 200Y is the second predetermined position, an arc section thereof on the second side in the perpendicular direction 200X with respect to the second predetermined position is one opposed portion 205C, and an arc section thereof on the opposite second side is the other opposed portion 205C. When the base end portion 53 of the go-around latch portion 5 is at the second predetermined position, the base end portion 53 is in contact with both the opposed portions 205C, 205C, and the both-contact state corresponds to the state of being sandwiched from both sides between the opposed portions 205C, 205C.

As described above, in the second embodiment, there is one location where the insertion latch portion 4 presses the first attachment hole 204, and there are two locations where the base end portions 53 of the go-around latch portions 5 press the second attachment holes 205. Thus, pressing in the latch portion opposition direction 200Y is performed at three locations in total. Such three-point support is stable as compared to two-point or one-point support and is efficient as compared to four-or-more-point support. Therefore, the bracket 1 of the second embodiment also can be stably assembled to the panel member 200 without rattling. It is noted that the number of insertion latch portions 4 and the number of go-around latch portions 5 may be reversed to each other, that is, there may be two pressing locations of the first attachment holes 204 and there may be one pressing location of the second attachment hole 205.

In the case where the total number of insertion latch portions 4 and go-around latch portions 5 is three as in the second embodiment, the following configuration may be employed.

Figure 28:
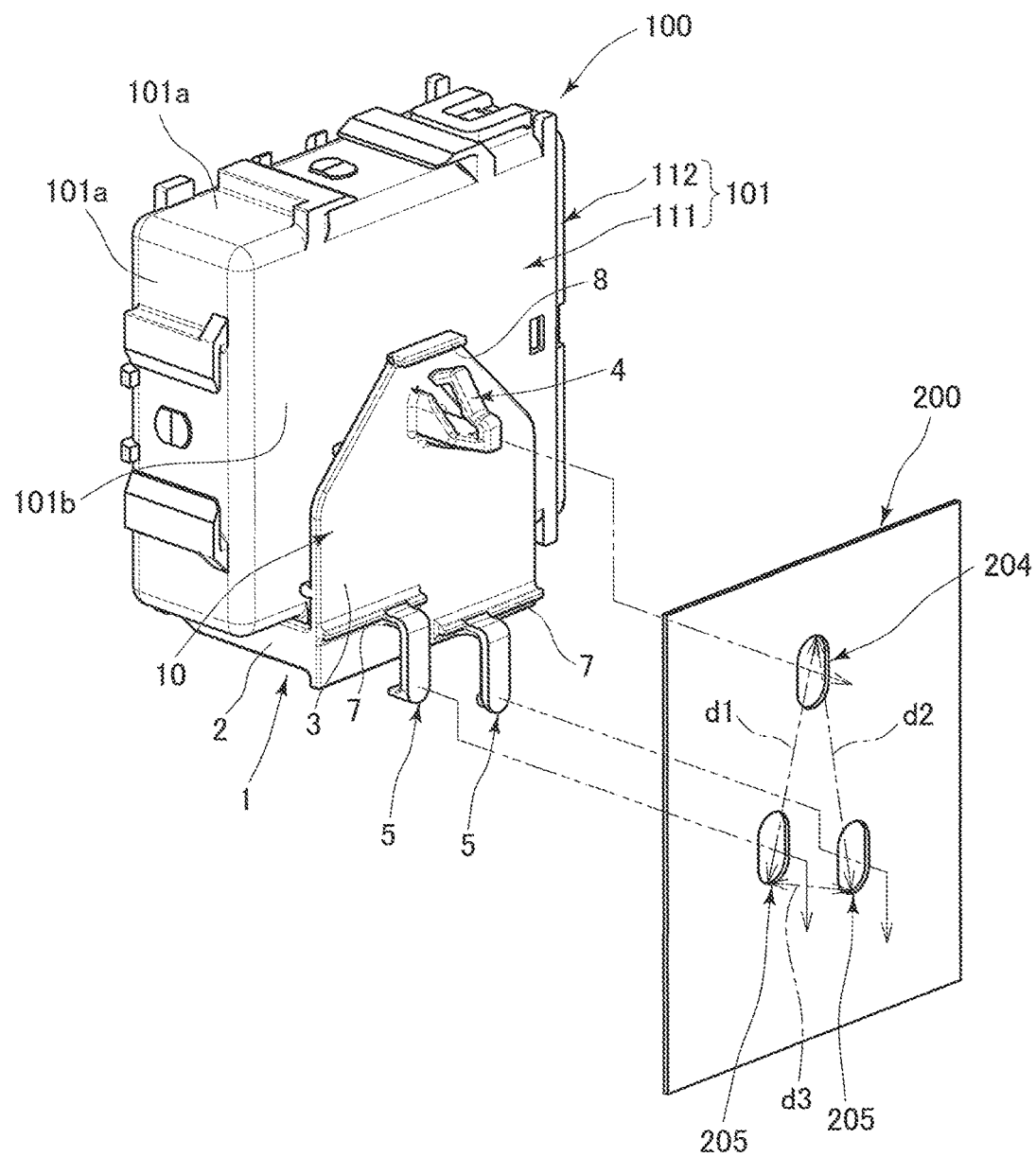
FIG. 28 is an exploded perspective view showing a bracket and a panel member separated from each other in an attachment structure for the bracket and the panel member according to the third embodiment of this invention.

That is, in the second embodiment, the distances from one insertion latch portion 4 to two go-around latch portions 5 are the same. However, for example, as shown in FIG. 28, three latch position distance d1, d2, d3 each defined as a distance from one latch portion to another latch portion among the three latch portions may be different from each other. In the case of performing assembly to the panel member via three latch portions as described above, if the distances from one latch portion to the other two latch portions are the same, there is a possibility that, on a plane parallel with the panel member, the two latch portions located at equal distances from the one latch portion are rocked along the same arc locus centered on the one latch portion and thus the bracket is rattled. However, if the distances from one latch portion to the other two latch portions are different as described above, the rocking loci of the two latch portions do not coincide with each other, so that rocking can be prevented and rattling can be suppressed.

In the third embodiment shown in FIG. 28, the distance d1 from the latch position of the insertion latch portion 4 to the latch position of one go-around latch portion 5, the distance d2 from the latch position of the insertion latch portion 4 to the latch position of the other go-around latch portion 5, and the distance d3 between the latch positions of the two go-around latch portions 5, are different from each other.

It is noted that, as shown in FIG. 28, the above latch position distances d1, d2, d3 each refer to a distance (which can be also said to be a contact position distance or a pressing position distance) between latch positions where the attachment hole 204, 205 provided to the panel member 200 and the latch portion 4, 5 of the bracket 1 inserted thereto are latched (contact) with each other in the attached state of the bracket 1 and the panel member 200.

Figure 29:
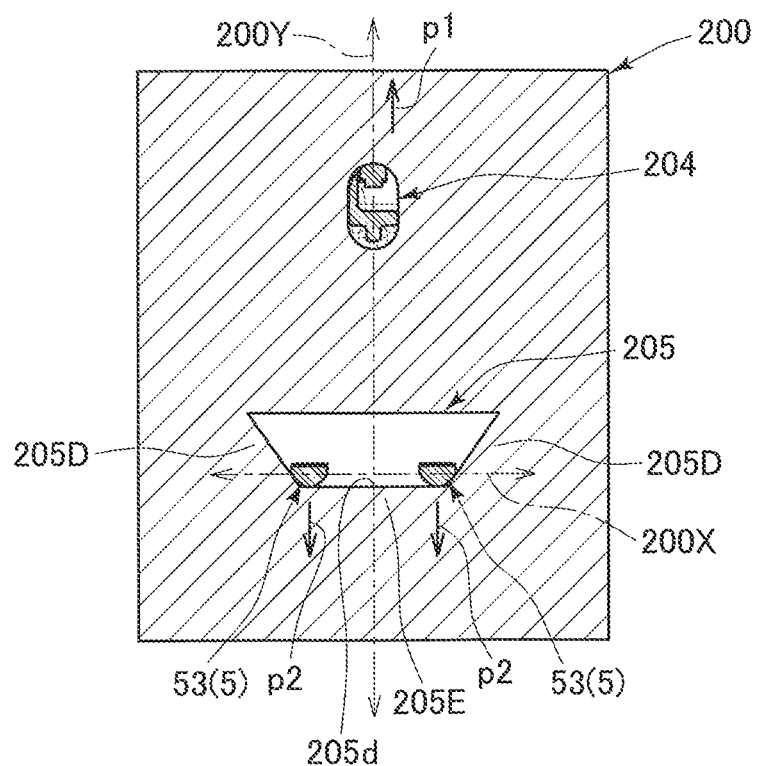
FIG. 29 is a sectional view showing the attachment structure for a bracket and a panel member according to the fourth embodiment of this invention, when the panel member is cut along a plane parallel with the main surface thereof.

In the case where one insertion latch portion 4 and one go-around latch portion 5 are provided as in the first embodiment, a configuration different from the first embodiment may be employed. For example, the fourth embodiment shown in FIG. 29 may be employed.

In the second and third embodiments, one latch portion 4, 5 is inserted into one attachment hole 204, 205. However, two latch portions 4, 5 may be inserted into one attachment hole 204, 205. For example, as in the fourth embodiment shown in FIG. 29, two go-around latch portions 5, 5 may be inserted into one second attachment hole 205. In this case, the configuration of the first attachment hole 204 and the insertion latch portion 4 is the same as in the second and third embodiments, but the configuration of the second attachment hole 205 and the go-around latch portions 5 is different from the second and third embodiments.

That is, in the fourth embodiment, the inner edge 205$d$ of the second attachment hole 205 has opposed portions 205D, 205D. When the base end portions 53, 53 of the two go-around latch portions 5, 5 are pressed toward the second side (lower side in FIG. 29) in the latch portion opposition direction 200Y, the opposed portions 205D, 205D are opposed on both sides in the perpendicular direction 200X perpendicular to the pressing direction p2 of the bracket 1 by the base end portions 53, 53, and the opposition width thereof narrows toward the second side in the latch portion opposition direction 200Y. In this configuration, the inner edge 205$d$ of the second attachment hole 205 has a movement restricting portion 205E on the second side (lower side in FIG. 29) in the latch portion opposition direction 200Y with respect to the opposed portions 205D, 205D. When the base end portions 53, 53 of the two go-around latch portions 5, 5 are pressed toward the second side, the movement restricting portion 205E comes into contact with the base end portions 53, 53 pressed toward the second side along the opposed portions 205D, 205D, and thus serves as a wall portion preventing the movement caused by the pressing.

Next, the fifth embodiment will be described with reference to FIG. 30A to FIG. 30C, FIG. 31A, and FIG. 31B.

Figure 30A:
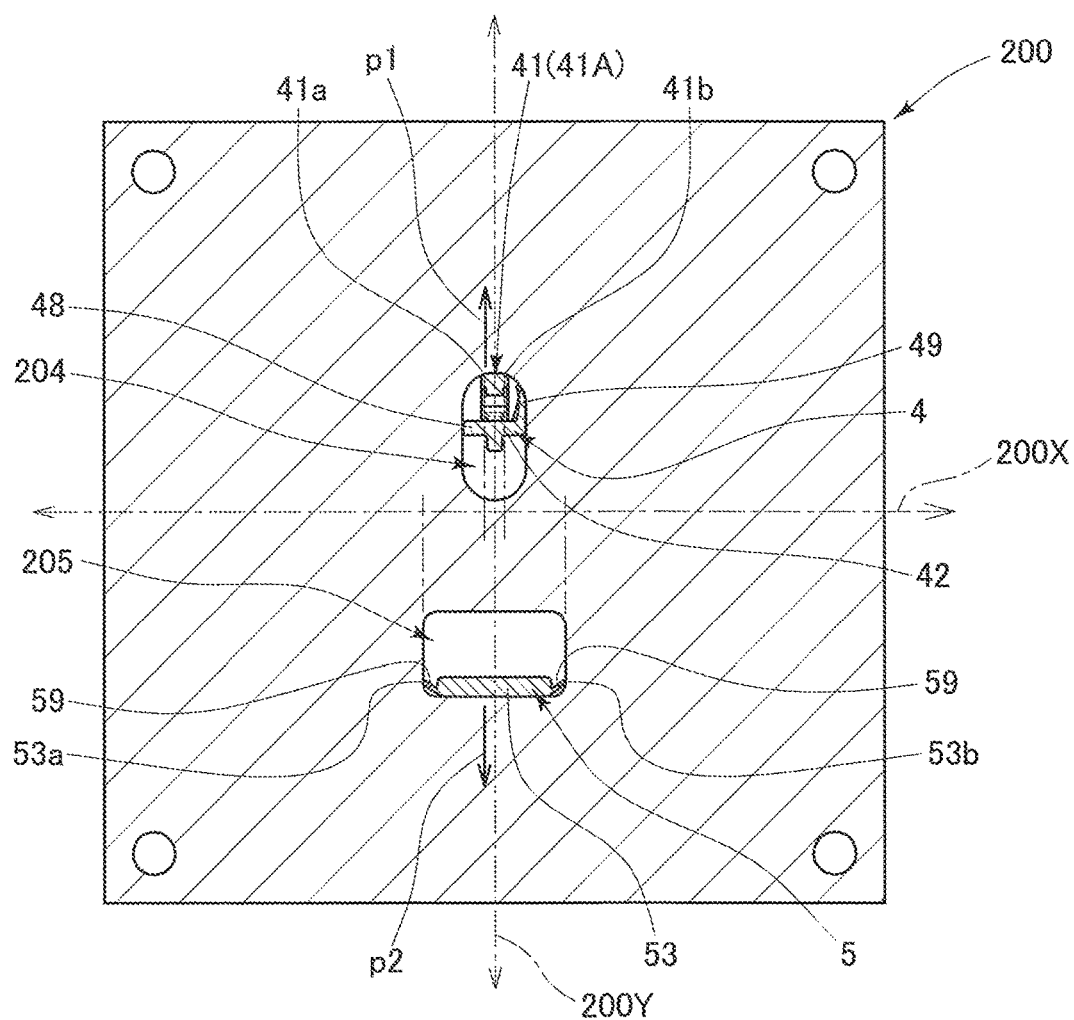
FIG. 30A is a sectional view showing a state in which latch portions are inserted into attachment holes of a panel member in an attachment structure for the bracket and the panel member according to the fifth embodiment of this invention, when the panel member is cut along a plane parallel with the main surface thereof.
Figure 30B:
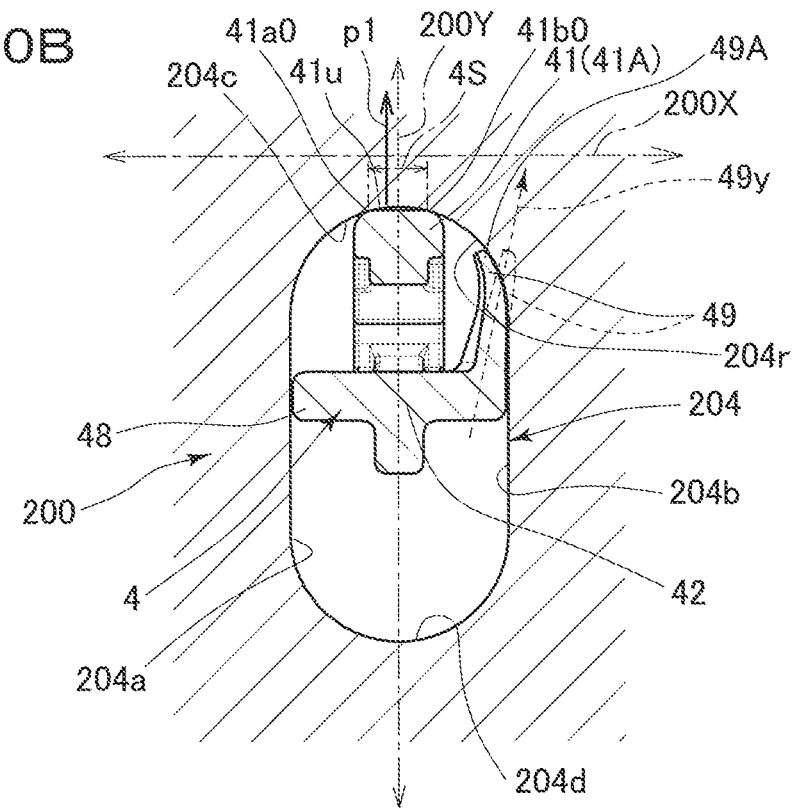
FIG. 30B is an enlarged sectional view of a part around an insertion latch portion in FIG. 30A.

In the fifth embodiment, as shown in FIG. 30A and FIG. 30B, four corners of the first attachment hole 204 provided to the panel member 200 are formed in an arc shape having a larger diameter than in the other embodiments. More specifically, the first attachment hole 204 has substantially an elliptic shape in which both inner edges 204$c$, 204$d$ on the first side and the second side in the latch portion opposition direction 200Y have an arc shape and the inner edges 204$a$, 204$b$ on both sides in the direction 200X perpendicular to the latch portion opposition direction 200Y have a straight shape.

The insertion latch portion 4 is formed in the same manner as in the other embodiments. The first attachment hole inner edge pressing portions 48, 49 are formed at both side ends in the perpendicular direction 200X of the pillar portion 42, and the first attachment hole inner edge pressing portion 49 on one side (here, right side in FIG. 30B) is an elastic piece 49 which extends toward the first side (upper side in FIG. 30B) in the latch portion opposition direction 200Y and which is elastically deformable inward (toward the first attachment hole inner edge pressing portion 48 side: leftward in FIG. 30B) in the perpendicular direction 200X.

The first attachment hole 204 has such a curved shape that an inner edge 204$r$ thereof pressed by the elastic piece 49 (distal end portion 49A thereof) in the inserted latched state of the insertion latch portion 4 is curved inward (leftward in FIG. 30B) in the perpendicular direction 200X as approaching the first side (upper side in FIG. 30B) in the latch portion opposition direction 200Y. The inner edge 204$r$ is one end side of the inner edge 204$c$, of the first attachment hole 204, that is on the first side in the latch portion opposition direction 200Y, and the extending end side (distal end portion 49A) of the elastic piece 49 pressed to the inner edge 204$r$ is elastically deformed along the curved shape of the inner edge 204$r$. Thus, the first attachment hole 204 is pressed by the elastically deformed elastic piece 49 toward both of the first side (upper side in FIG. 30B) in the latch portion opposition direction 200Y and the outer side in the perpendicular direction 200X (right side in FIG. 30B).

Figure 30C:
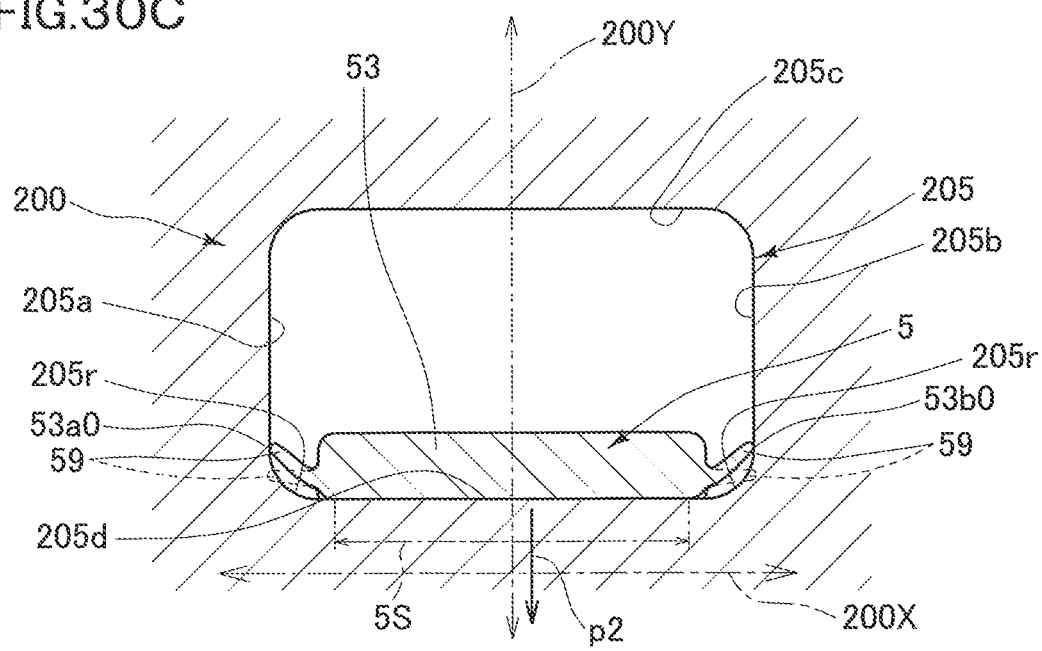
FIG. 30C is an enlarged sectional view of a part around a go-around latch portion in FIG. 30A.

As shown in FIG. 30B, the elastic latch piece 41 of the insertion latch portion 4 has such a shape as to press the arc-shaped inner edge 204$c$ of the first attachment hole 204, at two positions 41$a$0, 41$b$0 on one side and the opposite other side with respect to the center in the perpendicular direction 200X perpendicular to the pressing direction p1 (200Y) to the first side, in the inserted latched state of the insertion latch portion 4. On the other hand, as shown in FIG. 30C, the base end portion 53 of the go-around latch portion 5 has such a shape as to have contact with the inner edge of the second attachment hole 205, on both sides in the perpendicular direction 200X. That is, the base end portion 53 has second attachment hole inner edge pressing portions 59, 59 protruding outward on both end sides in the perpendicular direction, and the second attachment hole inner edge pressing portions 59, 59 have such shapes as to have contact with the inner edges 205$a$, 205$b$ of the second attachment hole 205 that are on both sides in the perpendicular direction 200X. As shown in FIG. 30A, contact positions 53$a$0, 53$b$0 where the base end portion 53 of the go-around latch portion 5 is in contact with the inner edges 205$a$, 205$b$ of the second attachment hole 205 are located outward in the perpendicular direction 200X relative to the two positions 41$a$0, 41$b$0 where the elastic latch piece 41 of the insertion latch portion 4 presses the inner edge 204$c$ of the first attachment hole 204.

Figure 31A:
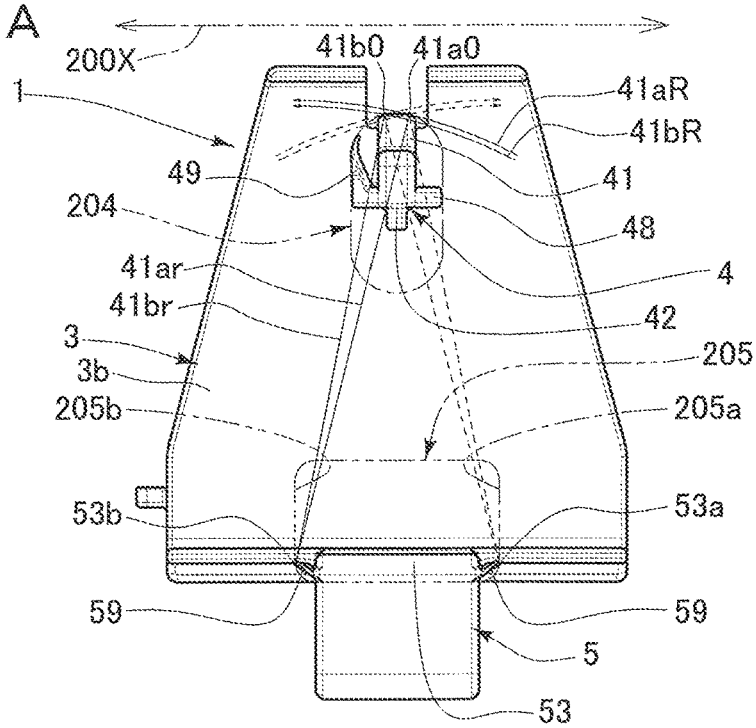
FIG. 31A illustrates rattling of the bracket, using a back view of the bracket attached to the panel member in FIG. 30A.

Here, the case where vibration in the perpendicular direction 200X occurs on the bracket 1 will be considered. FIG. 31A shows a back surface 3$b$ side (i.e., back side of main surface 3$a$) of the bracket 1 in a state of being attached to the panel member 200, and the first attachment hole 204 and the second attachment hole 205 of the panel member 200 are indicated by two-dot dashed lines.

Figure 31B:
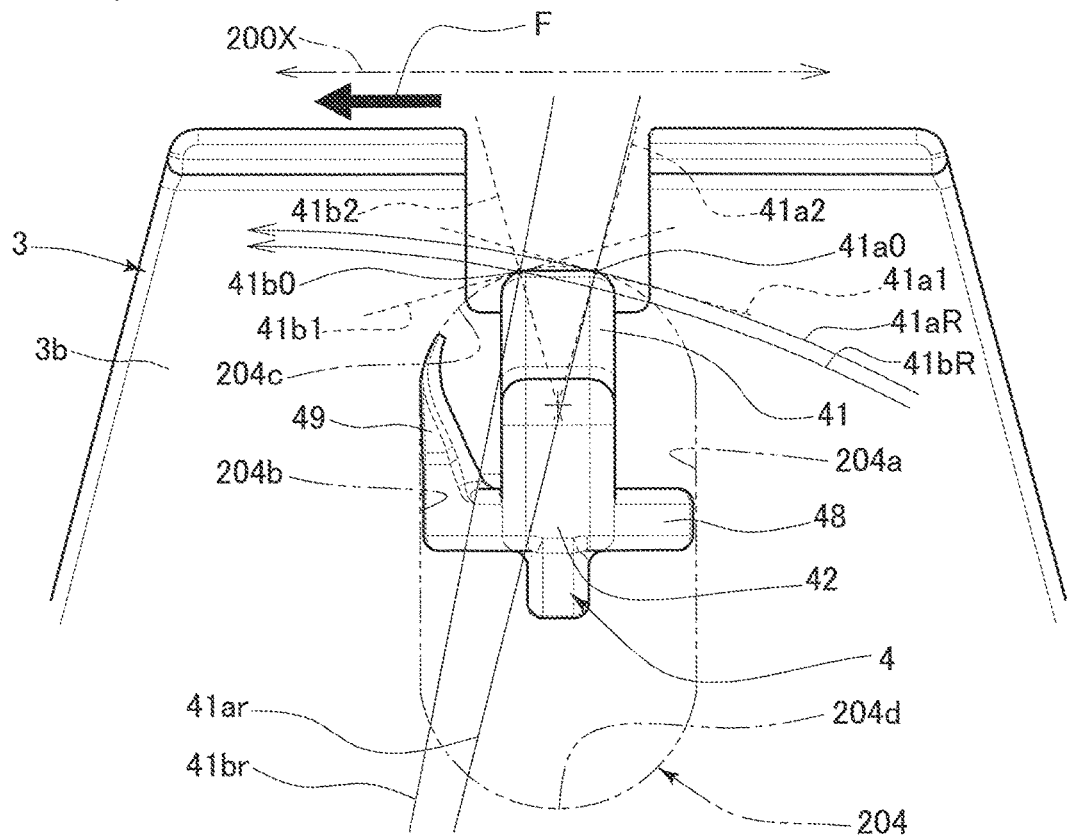
FIG. 31B is a partially enlarged view of FIG. 31A.

When the vibration occurs, the insertion latch portion 4 is displaced in the right-left direction in FIG. 31A. As shown in FIG. 31B, when a force F is applied so as to displace the insertion latch portion 4 leftward in FIG. 31A, the insertion latch portion 4 is subjected to a leftward force so as to be rotated about the contact position 53$b$ where the second attachment hole inner edge pressing portion 59 on the left side in FIG. 31A is in contact with the inner edge 205$b$ of the second attachment hole 205. This force is composed of forces acting in directions of arrows 41$a$R, 41$b$R at the two positions 41$a$0, 41$b$0. It is noted that reference characters 41$ar$, 41$br$ denote radial directions from the contact position 53$b$ as the rotation center toward the two positions 41$a$0, 41$b$0. The insertion latch portion 4 presses the arc-shaped inner edge 204$c$ of the first attachment hole 204 at the two positions 41$a$0, 41$b$0, and is displaced leftward in the drawing while sliding on the arc-shaped inner edge 204$c$ by the pressing force. Here, of the forces acting at the two positions 41$a$0, 41$b$0, the force acting at one position 41$b$0 has a component directed in a tangent direction 41$b$1 on the arc-shaped inner edge 204$c$ of the first attachment hole 204, and also has a comparatively great component directed in a normal direction 41$b$2 thereof. Therefore, at the pressing position 41*b*0 of the insertion latch portion 41, not only a force in the tangent direction 41*b*1 acts so as to cause sliding along the arc-shaped inner edge 204*c*, but also a force in the direction 41*b*2 acts so as to press the arc-shaped inner edge 204*c*. That is, the force F applied to the bracket 1 by the vibration is partially received by the inner edge 204*c* as a force of pressing the arc-shaped inner edge 204*c*, whereby the force of acting in the direction along the arc-shaped inner edge 204*c* is decreased, and thus a sliding displacement, i.e., rattling, along the inner edge 204*c* can be suppressed. The same applies to the case where the insertion latch portion 4 is displaced rightward in FIG. 31A (in this case, a tangent direction 41*a*1 corresponds to the tangent direction 41*b*1, and a normal direction 41*a*2 corresponds to the normal direction 41*b*2). Thus, in the fifth embodiment, the elastic latch piece 41 have two-point contact with the arc-shaped inner edge 204*c* of the first attachment hole 204, whereby rattling of the bracket 1 can be suppressed.

DESCRIPTION OF THE REFERENCE CHARACTERS 1000 assembly structure for bracket
2000 attachment structure for bracket
1 bracket
10 bracket body
2 side surface opposed portion
20 assembly portion
20G opposition clearance (second opposition clearance)
21 insertion portion
21*a* upper surface of insertion portion
21*b* side surface of insertion portion
21T sliding projection
22 detachment preventing latch portion
23 abutting wall portion
23K cutout portion
3 main surface opposed portion
39 cutout portion
4 insertion latch portion
41 elastic latch piece
42 pillar portion
48, 49 attachment hole inner edge pressing portion
5 go-around latch portion
51 intermediate portion
52 distal end portion
53 base end portion
59 attachment hole inner edge pressing portion
7 fulcrum portion
9D jig
9S space
100 electronic control unit (ECU)
101 case
101*a* outer peripheral side surface
101*b* main surface
102 assembly portion
102A elastic pressing portion (pressing portion)
102B opposed wall portion
102G gap (first opposition clearance)
103 protrusion
111 body part
112 cover
111H opening
110K assembly portion
200 panel member (predetermined member)
204 first attachment hole
205 second attachment hole
I insertion direction
J receiving direction
S outer circumferential direction

What is claimed is:

1. A bracket for attaching an electronic control unit to a predetermined member, the bracket comprising:
   a bracket body having a main surface opposed portion which is to face a main surface of a case of the electronic control unit, and a side surface opposed portion which extends in a bending direction from the main surface opposed portion and which is to face an outer peripheral side surface of the case;
   a plate-shaped insertion portion to be inserted into a gap between the outer peripheral side surface of the case and an elastic pressing portion which protrudes from the outer peripheral side surface and then, at a protruding end thereof, bends and extends in an outer circumferential direction of the case;
   a detachment preventing latch portion configured to, when the insertion portion is inserted to a predetermined assembled position in the gap, be latched with a predetermined latch portion of the case, thereby retaining the case in a detachment prevented state; and
   abutting wall portions which extend toward the outer peripheral side surface of the case from the side surface opposed portion, on both outer sides in the outer circumferential direction of the insertion portion, and which are to be located in contact with the outer peripheral side surface.

2. The bracket according to claim 1, wherein the abutting wall portions are formed to extend along an insertion direction of the insertion portion and are connected to the main surface opposed portion.

3. The bracket according to claim 1, wherein the side surface opposed portion has, in a state of being assembled to the case, a frame shape having: an end frame portion opposed to the main surface opposed portion; a first side frame portion connecting the end frame portion and the main surface opposed portion, on a first side in the outer circumferential direction; a second side frame portion connecting the end frame portion and the main surface opposed portion, on a second side opposite to the first side; and a central frame portion connecting the end frame portion and the main surface opposed portion, at a center in the outer circumferential direction,
   on the end frame portion, the detachment preventing latch portion protruding downward is formed at a center of a zone between a central connection portion connected with the central frame portion and each of side connection portions connected with the first and second side frame portions, and the end frame portion has, on both sides of the center of the zone, weak portions having lower rigidity than the detachment preventing latch portion, and
   at a time of bringing the case into the detachment prevented state,
   the insertion portion of the bracket is inserted into the gap between the outer peripheral side surface and the elastic pressing portion of the case in a predetermined insertion direction which is parallel with the outer peripheral side surface and perpendicular to the outer circumferential direction of the case,
   in the insertion, the elastic pressing portion of the case is received in a direction opposite to the insertion direction through an opposition clearance between each detachment preventing latch portion protruding downward and the insertion portion in the bracket, whereby the insertion portion reaches the assembled position in the gap, while in the reception, the elastic pressing portion presses each detachment preventing latch portion, whereby a center of the end frame portion is pushed up with the weak portions elastically deformed, so as to expand the opposition clearance and allow the elastic pressing portion to be received, and after the reception, the end frame portion is elastically restored, whereby the received elastic pressing portion is, as the predetermined latch portion, latched by the detachment preventing latch portion, so that the detachment prevented state is established.

4. An assembly structure for bracket, for assembling the bracket according to claim 1 to a case of an electronic control unit, wherein the case has a protrusion protruding outward, at a position corresponding to one of the abutting wall portions on the outer peripheral side surface of the case, and the bracket has, in the one of the abutting wall portions, a cutout portion formed so as not to interfere with the protrusion.

5. The assembly structure for bracket according to claim 4, wherein the case has a body part having an opening in one surface of an outer periphery of the case, and a cover assembled so as to cover the opening, the cover has assembly portions assembled so as to overlap both outer peripheral side surfaces adjacent to the opening on the outer periphery of the case and thus each forming the protrusion, and the cutout portion is to be located so as to overlap the corresponding assembly portion, thereby preventing release of an assembled state of the cover with respect to the opening.

* * * * *